United States Patent
Gliese et al.

(10) Patent No.: US 7,386,812 B2
(45) Date of Patent: Jun. 10, 2008

(54) LOGIC BASIC CELL AND LOGIC BASIC CELL ARRANGEMENT

(75) Inventors: Jörg Gliese, Munich (DE); Mirko Sauermann, Neubiberg (DE)

(73) Assignee: Infineon Technologies AG (DE)

( * ) Notice: Subject to any disclaimer, the term of this patent is extended or adjusted under 35 U.S.C. 154(b) by 152 days.

(21) Appl. No.: 10/995,960

(22) Filed: Nov. 22, 2004

(65) Prior Publication Data

US 2005/0140389 A1    Jun. 30, 2005

(30) Foreign Application Priority Data

Nov. 21, 2003  (DE) ................ 103 54 499
May 25, 2004  (DE) ............ 10 2004 025 579

(51) Int. Cl.
*G06F 17/50* (2006.01)

(52) U.S. Cl. ................. 716/1; 716/16; 716/17

(58) Field of Classification Search ............ 716/1, 716/16–18
See application file for complete search history.

(56) References Cited

U.S. PATENT DOCUMENTS

| | | | |
|---|---|---|---|
| 5,386,156 A | 1/1995 | Britton et al. | |
| 6,178,541 B1 * | 1/2001 | Joly et al. ................ | 716/17 |
| 6,331,789 B2 | 12/2001 | Or-Bach | |
| 6,505,337 B1 * | 1/2003 | Wittig et al. ............ | 716/17 |
| 6,529,040 B1 | 3/2003 | Carberry et al. | |
| 2002/0010902 A1 * | 1/2002 | Chen et al. ............. | 716/16 |
| 2002/0043988 A1 | 4/2002 | Or-Bach et al. | |
| 2002/0162078 A1 * | 10/2002 | Boppana et al. ........ | 716/1 |
| 2003/0206036 A1 | 11/2003 | Or-Bach | |
| 2004/0049759 A1 * | 3/2004 | Osann et al. ........... | 716/16 |

FOREIGN PATENT DOCUMENTS

| | | |
|---|---|---|
| EP | 0 701 328 A2 | 3/1996 |
| EP | 1 150 431 A1 | 10/2001 |
| WO | WO-02/093745 A2 | 11/2002 |

OTHER PUBLICATIONS

Wannemacher, M; "Das FPGA-Kochbuch", ("The FPGA Cookbook"), fig. 7.36: logic block (CLB) of the XC4000 families, 1st edition, International Thomson Publishing Company, Bonn, 1998, p. 197.

* cited by examiner

Primary Examiner—Paul Dinh
(74) Attorney, Agent, or Firm—Dickstein, Shapiro, LLP

(57) ABSTRACT

Logic basic cell and logic basic cell arrangement having a plurality of logic basic cells. A logic basic cell includes at least six data signal inputs, a first logic function block and a second logic function block, at least one logic function configuration input, a first multiplexer and a second multiplexer.

28 Claims, 9 Drawing Sheets

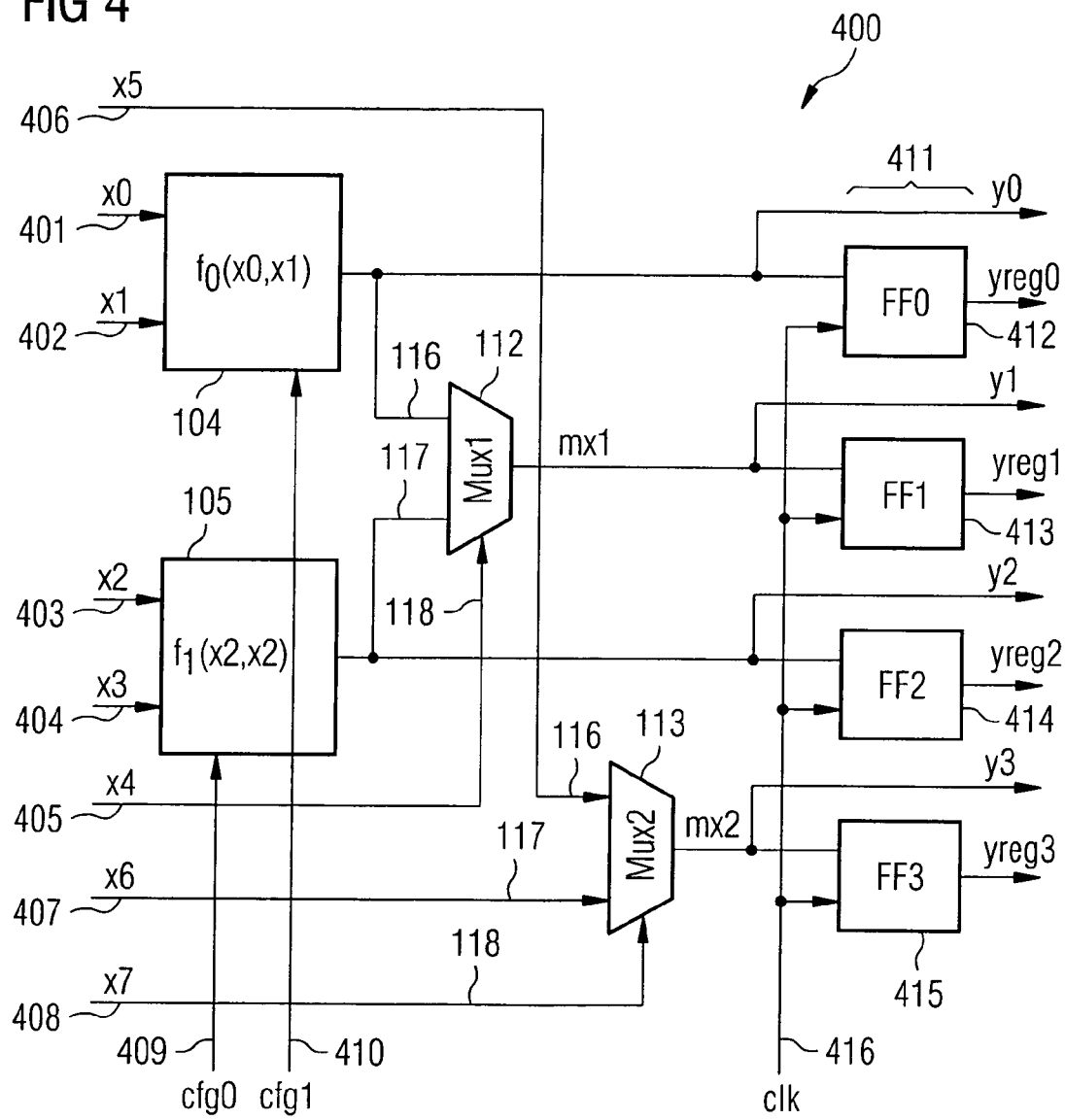

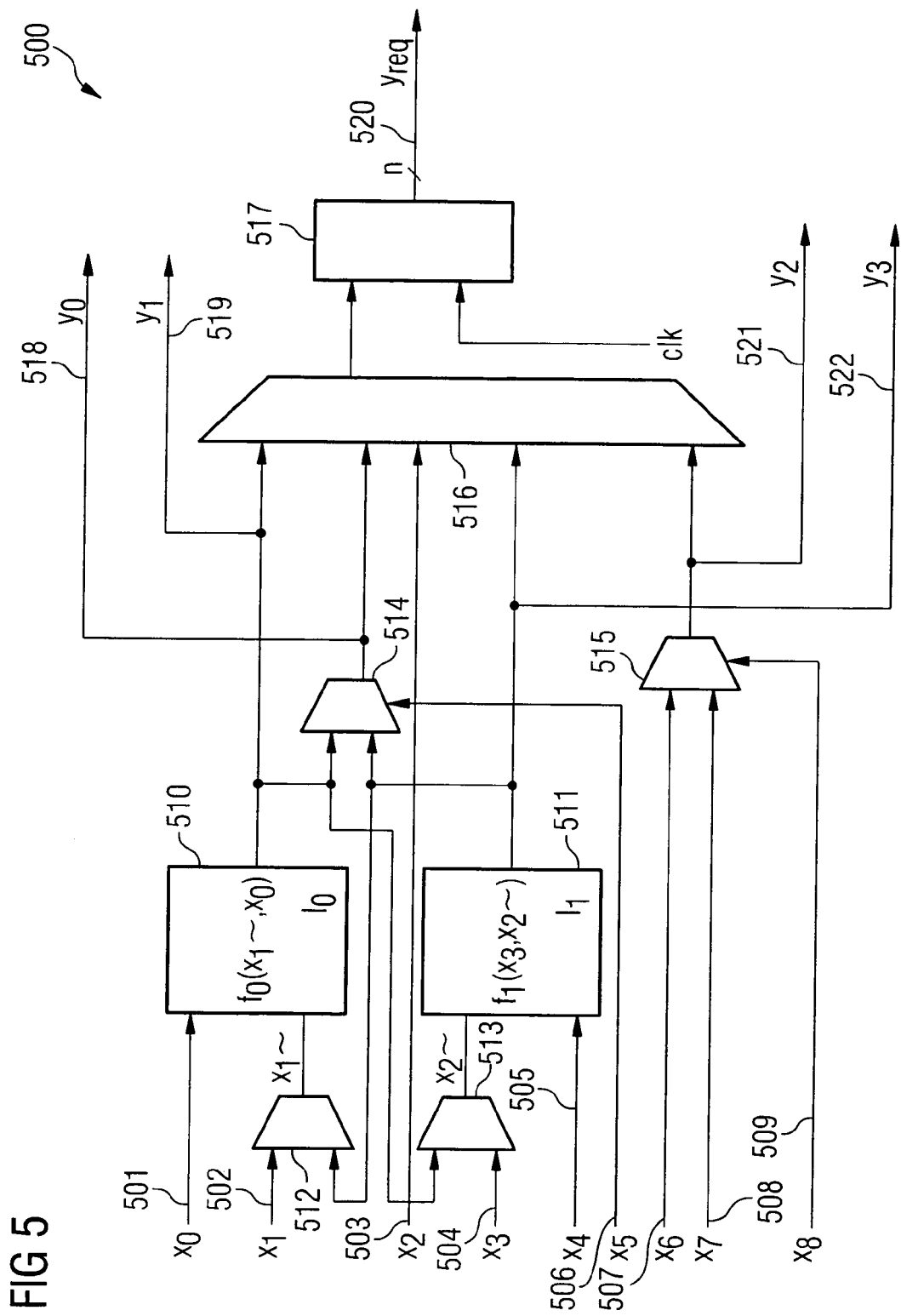

— 601
▭ 602
▨ 603

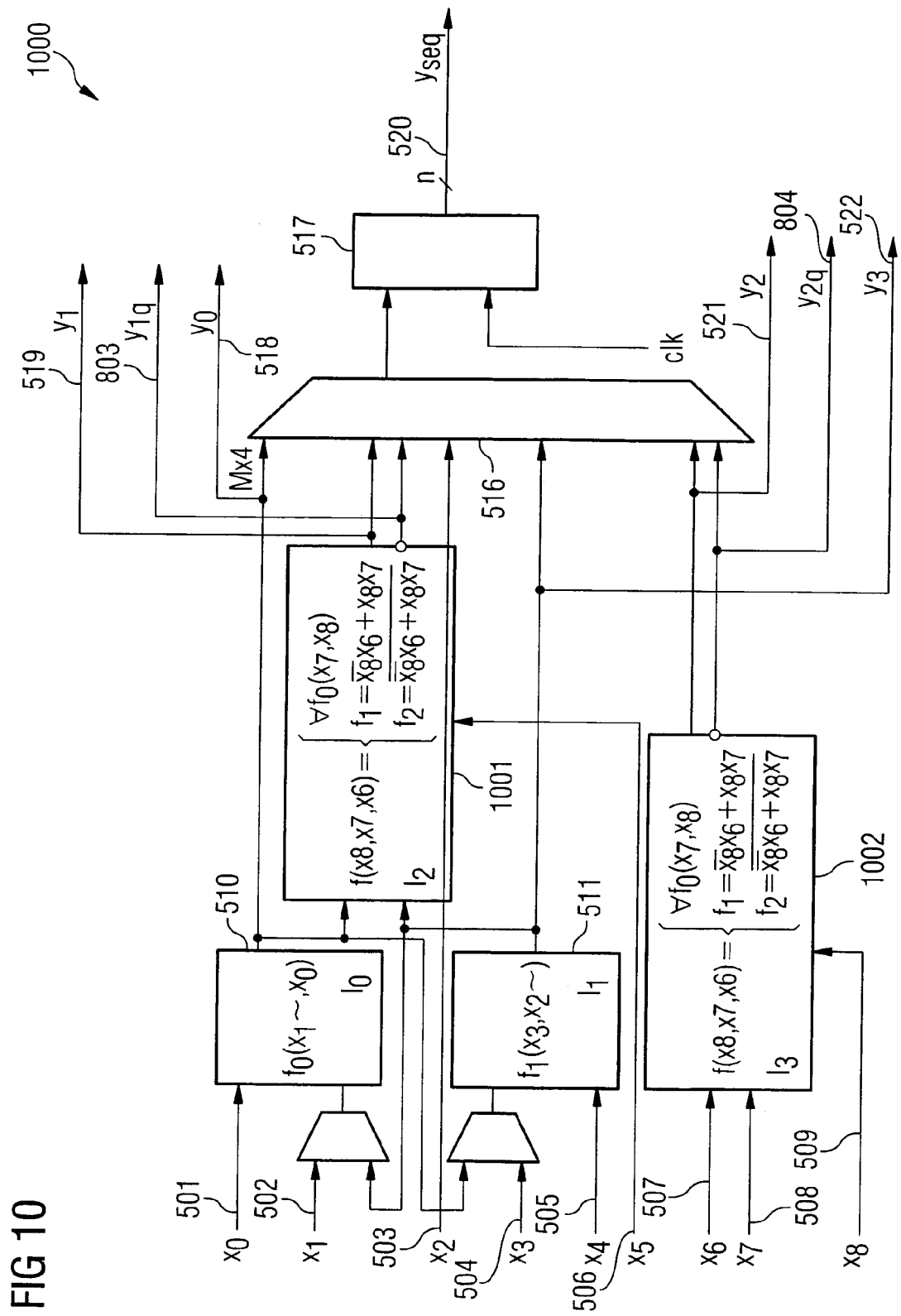

LOGIC BASIC CELL AND LOGIC BASIC CELL ARRANGEMENT

CROSS-REFERENCE TO RELATED APPLICATION

This application claims priority to German Patent Application Serial No. 103 54 499.2 filed Nov. 21, 2003, and German Patent Application Serial No. 10 2004 025 579.2 filed May 25, 2004.

FIELD OF THE INVENTION

The invention relates to a logic basic cell and a logic basic cell arrangement.

BACKGROUND OF THE INVENTION

The advent of digital technology and the rapid development of microprocessor technology gave rise to a demand for programmable logic. A PLD ("programmable logic device") is an integrated circuit whose logic function is defined by the user by means of programming. A PLD is an architecture for digital logic operations with a plurality of switches that enable a multiplicity of signal paths. The logic function assigned to a PLD in a user-specific fashion is defined by means of configuration of the PLD.

PLDs include, inter alia, field-programmable gate arrays (FPGA), the functionality of which can be assigned to them by the user, mask-programmable gate arrays (MPGA, also called "structured ASICs"), which can be allocated a logic function by means of hardware configuration. Via-programmable gate arrays (VPGAs) are included among MPGAs.

Basic cells for a field-programmable gate array (FPGAs) and a structured ASIC (sASIC) provide combinatorial functionality and registers for implementing a design. A basic cell is intended to ensure a good mappability both of simple and of complex logic functions without generating unnecessary overhead.

A digital logic cell maps n input signals onto an output signal. The number of possible mapping functions is $2^{2^n}$. A circuit group as a digital logic cell is realized in accordance with the prior art for example using so-called look-up tables (LUT). For this purpose, function values of the logic function are set by means of a data word of $2^n$ bits. In other words, the respectively logic function is coded into a data word. n input signals $a_0, a_1 \ldots a_{n-1}$ are combined with one another in accordance with the selected logic function. Consequently, the logic input signals of the logic function $y=f(a_0, a_1, \ldots, a_{n-1})$ may be regarded as a binary address.

An FPGA based on a look-up table (LUT) is disclosed in U.S. Pat. No. 6,529,040 B1, for example.

A logic basic cell for field-programmable gate arrays (FPGA) and "structured ASICs" provide combinatorial functionality for implementing a logic design.

The prior art discloses fine-granularity and coarse-granularity approaches for logic basic cells.

In the case of a fine-granularity basic cell, it is often not possible to realize all the possible $2^{2^n}$ logic functions of n input signals, so that in some scenarios logic functions of low complexity already have to be realized in a manner distributed over a plurality of basic cells. Interconnect resources are blocked in this way, which leads to a less effective utilization of resources. Furthermore, in the case of such fine-granularity basic cells, long signal paths are disadvantageous in the case of more complex functions. Furthermore, the software for the partitioning of such fine-granularity basic cell arrangements is complex.

A coarse-granularity approach involves realizing a complex basic cell by means of which it is often possible for logic functions also of medium complexity to be realized completely. On the other hand, if a short data path is intended to be mapped onto such a coarse-granularity basic cell, large portions of the combinatorial resources of the basic cell are unutilized, with the result that the mapping is inefficient. Furthermore, the scalability of known basic cells is often unsatisfactory, particularly if a logic function to be mapped does not match a basic cell.

U.S. Pat. No. 6,331,789 B2 discloses a logic array apparatus with an array of programmable logic cells, having a plurality of inputs and a plurality of outputs and adapted connecting structures which are superposed on a portion of the programmable cell.

Inputs may serve as control inputs for a multiplexer tree, see Wannemacher, M "Das FPGA-Kochbuch", ["The FPGA Cookbook"], fig. 7.36: logic block (CLB) of the XC4000 families, 1st edition, International Thomson Publishing Company, Bonn, 1998, p. 197. The multiplexers may be realized in a logic-based fashion and/or on the basis of transmission gates.

U.S. 2003/0206036 A1 discloses a user-defined configurable and programmable logic basic cell arrangement based on an interconnection of look-up tables and multiplexers.

U.S. 2002/0043988 A1 discloses a programmable logic basic cell arrangement having 5 data signal inputs and also a first logic function block and a second logic function block, implemented as a look-up table, a logic function configuration input and also a first multiplexer. At the data signal outputs, it is possible to tap off separately a signal at the output of the first logic function block, a signal at the output of the second logic function block and a signal at the output of the multiplexer.

EP 0 701 328 A2 discloses a field-programmable gate array (FPGA) having a decoder circuit arrangement for increasing the number of inputs for each programmable logic cell. The decoder circuit arrangement couples the respective desired look-up table of a respective logic cell.

EP 1 150 431 A1 discloses another FPGA with look-up tables.

U.S. Pat. No. 5,386,156 describes a programmable function unit set up for use in an FPGA, so-called ripple logic being used in the programmable function unit.

Furthermore, WO 02/093745 A2 discloses a reconstructable logic apparatus with a look-up table.

Many logic basic cells disclosed in the prior art are based on Boolean logic. Such logic basic cells make use of the fact that a function $f(a_n, a_{n-1}, \ldots, a_0)$ of n+1 input signals $a_i$, in accordance with Boolean logic, can be reduced to two functions $f_0, f_1$ of in each case n input signals $a_i$ as follows:

$$f: IB^{n+1} \rightarrow IB: f(a_n, a_{n-1}, \ldots, a_1, a_0) = \bar{a}_n; f_0$$
$$(a_{n-1}, \ldots, a_0) \vee a_n; f_1(a_{n-1}, \ldots, a_0) = f_s(f_1, f_0, a_n) \quad (1)$$

The decomposition of f into $f_1$ and $f_0$ in accordance with equation (1) is referred to as so-called Shannon decomposition. In this case, $\bar{a}_n$ is the logic inverse of the data signal $a_n$. For the case n=2, that is to say where a function of n+1=3 input signals, the logic overall function f as a function of three input signals is thus reduced to two (simpler) logic subfunctions $f_0$ and $f_1$ of two input signals. Each of the logic subfunctions $f_0, f_1$ can be realized by one of the logic function blocks of a logic basic cell.

For the special case of n+1=4 input signals, using equation (1), the logic overall function can be reduced to two functions of three input signals, it being possible for each function of three input signals once again to be divided into two logic subfunctions with two inputs by applying equation (1) again. In other words, a logic overall function of four data signals can be decomposed into four logic subfunctions which can be realized by four logic function blocks, that is to say two logic basic cells. This consideration can be continued for an arbitrary number of input signals; by way of example, the realization of a logic overall function of five data signals requires 2*2*2=8 logic function blocks, that is to say four logic basic cells having in each case two logic function blocks.

However, a logic basic cell realized in accordance with the Shannon decomposition in accordance with equation (1) is not well suited to many applications requiring a high degree of flexibility.

SUMMARY OF THE INVENTION

The invention is based on the problem, in particular, of providing a logic basic cell which provides an increased degree of flexibility.

The problem is solved by means of a logic basic cell and by means of a logic basic cell arrangement having the features in accordance with the independent patent claims.

Preferred configurations of the invention emerge from the dependent patent claims.

A logic basic cell for forming at least one output signal from at least three input signals in accordance with a predeterminable logic function has a first logic decomposition unit for realizing a first decomposition of the logic function into a plurality of logic subfunctions and also a second logic decomposition unit for realizing a second decomposition of the logic function into a plurality of logic subfunctions. The first logic decomposition unit and the second logic decomposition unit are set up
 for realizing a Shannon decomposition, or
 for realizing an iterative decomposition, or
 for realizing a disjoint decomposition.
  In accordance with one configuration of the invention, the first unit is a Shannon decomposition unit for realizing a Shannon decomposition of a logic function into a plurality of logic subfunctions.

A logic basic cell arrangement contains a plurality of logic basic cells having the features mentioned above.

In accordance with one aspect of the invention, a logic basic cell has at least five data signal inputs, it being possible for a data signal to be provided at each data signal input. Furthermore, the logic basic cell contains a first logic function block, which is coupled to a first data signal input and a second data signal input of the data signal inputs, and a second logic function block, which is coupled to a third data signal input and a fourth data signal input of the data signal inputs. Furthermore, at least one logic function configuration input is provided, by means of which it is possible to predetermine a logic subfunction which can be realized by the respective logic function block from a plurality of logic subfunctions which can be realized for combining the data signals present at the respective logic function block. The logic basic cell contains a first logic decomposition unit, the first data input of which is coupled to an output of the first logic function block, the second data input of which is coupled to an output of the second logic function block and the control input of which is coupled to a fifth data signal input of the data signal inputs. Furthermore, the logic basic cell contains a first data signal output coupled to the output of the first logic function block, a second data signal output coupled to the output of the second logic function block and a third data signal output coupled to an output of the first logic decomposition unit, at which data signal outputs it is possible to tap off separately in each case a signal at the output of the first logic function block, a signal at the output of the second logic function block and a signal at the output of the first logic decomposition unit.

One aspect of the invention may be seen in connecting up two logic function blocks and a first logic decomposition unit to one another in such a way, and applying data signals to the inputs thereof in such a way, that a logic subfunction can be realized as part of a logic overall function to be realized by a logic basic cell arrangement comprising a plurality of logic basic cells. Clearly, a partly processed signal is provided at an output of the first logic decomposition unit, which signal may be provided as an input signal for example to an input of a second logic decomposition unit of another logic basic cell of the logic basic cell arrangement. One or a plurality of input signals for a second logic decomposition unit of a logic basic cell of a logic basic cell arrangement may be provided by another logic basic cell which fulfills another logic subfunction of the logic overall function.

By virtue of the logic basic cell being set up in such a way that it is possible to tap off separately in each case a signal at the output of the first logic function block, a signal at the output of the second logic function block and a signal at the output of the first logic decomposition unit at first to third data signal outputs, these partly processed signals may be provided or fed separately in each case to other components of a more complex circuit. If a logic subfunction such as is generated by each of the logic function blocks from data signals is required elsewhere in such a more complex circuit, then this does not necessitate separate resources. In the same way, separate resources are not necessary if the output signal of the first logic decomposition unit is required at an arbitrary point in the circuit since the output signal can be tapped off separately at the third data signal output. These partly processed signals can be fed to other components of the circuit with low outlay. The tapping off of output signals of the logic function blocks which simultaneously serve as input signals of the first logic decomposition unit thus enables an optimized utilization of logic resources and leads to a high degree of flexibility and also a small required chip area.

Consequently, the logic basic cell according to the invention and a logic basic cell arrangement formed on the basis thereof make it possible simultaneously to reduce logic functions of high complexity to logic functions of lower complexity for the purpose of better processability and to tap off logic intermediate results at the outputs of the individual components of the logic basic cell separately for provision to other resources. The signals at the three data signal outputs can thus be tapped off at external terminals of the logic basic cell.

Furthermore, a logic overall function which is e.g. very complicated or depends on a large number of input signals can be divided, by means of the logic basic cell according to the invention, into a plurality of logic subfunctions which are less complicated or depend on a smaller number of input signals, it being possible for the logic subfunctions to be realized by different logic basic cells. As a result, a complex logic basic function is reduced to a plurality of simpler logic subfunctions, which can be realized in a modular interconnection of individual logic basic cells.

To put it another way, according to the invention, by means of an interconnection of logic basic cells with one another, an arbitrary complicated logic overall function that is dependent on a multiplicity of input signals can be reduced to simpler logic subfunctions of a smaller number of inputs by virtue of a preferably semiconductor-technological circuit architecture being created on the basis of Boolean logic.

The basic cell realizes a good mappability both of simple and of more complex logic functions without generating an unnecessary overhead. Consequently, a partitioning-improved or partitioning-optimized basic cell that can be used in an FPGA or a structured ASIC has clearly been created.

Consequently, a logic basic cell is provided which enables an uninterrupted improved partitionability for logic functions of n inputs, a high degree of flexibility and user-friendliness being achieved by means of the isolated tappability of partly processed signals at outputs of the logic function blocks. If a function of n inputs can be realized in precisely one logic basic cell, the invention makes it possible to realize a function of (n+1) inputs with at most two logic basic cells or a function of (n+i) inputs with at most $2^i$ logic basic cells. In this case, a logic basic cell is preferably realized in such a way that its combinatorics is likewise scaled. A basic cell with a combinatorial function of n inputs can also be constructed within the basic cell from two functions of (n−1) inputs, which two functions are realized by means of the two logic function blocks.

It should be noted that the logic results of the logic subfunctions of the logic function blocks are not only provided to inputs of the first logic decomposition unit, rather it is also possible to independently tap off output signals in accordance with these logic subfunctions. Consequently, such subfunctions are also available individually.

The selection of a logic subfunction (for example AND combination, OR combination, exclusive-OR combination, NAND combination, NOR combination, exclusive-NOR combination, etc.) of a logic function block is preferably effected by means of configuration of the logic function configuration input or inputs of the respective logic function block. In the circuitry realization, a logic function block may have transistors connected up to one another, in which case, by means of the application of logic function signals to the logic function configuration inputs of the logic function blocks, specific paths within the transistors can be activated, so that input signals can be processed in accordance with these selected paths in accordance with a predeterminable logic subfunction.

An explanation is given below of the logic basic cell on the basis of Boolean logic. Clearly, a statement of Boolean logic is used as a basis for a circuit architecture which is expressed in the logic basic cell according to the invention.

A function $f(a_n, a_{n-1}, \ldots, a_0)$ of n+1 input signals $a_i$ can be reduced, in accordance with Boolean logic, to two functions $f_0$, $f_1$ of in each case n input signals $a_i$ as follows:

$$f(a_n, a_{n-1}, \ldots, a_1, a_0) = \overline{a_n} \cdot f_0(a_{n-1}, \ldots, a_0) \vee a_n \cdot f_1(a_{n-1}, \ldots, a_0) \quad (2)$$

in this case, $\overline{a_n}$ is the logic inverse of the data signal $a_n$. For the case n=2, that is to say for a function of n+1=3 input signals, the logic overall function f as a function of three input signals is thus reduced to two logic subfunctions $f_0$ and $f_1$ with two input signals. Each of the logic subfunctions $f_0$, $f_1$ can be realized by one of the logic function blocks of a logic basic cell.

For the special case of n+1=4 input signals, using equation (2), the logic overall function can be reduced to two functions of three input signals, it being possible for each function of three input signals once again to be divided into two logic subfunctions with two inputs by applying equation (2) again. In other words, a logic overall function of four data signals can be decomposed into four logic subfunctions which can be realized by four logic function blocks, that is to say two logic basic cells according to the invention. This consideration can be continued for an arbitrary number of input signals; by way of example, the realization of a logic overall function of five data signals requires 2*2*2=8 logic function blocks, that is to say four logic basic cells having in each case two logic function blocks. These considerations illustrate the modular construction of the logic basic cell arrangement according to the invention.

In the case of the logic basic cell, the first data signal input may be coupled to the third data signal input and/or the second data signal input may be coupled to the fourth data signal input. In accordance with this interconnection, two data signals are processed in accordance with the first logic subfunction by the first logic function block and the same two data signals are processed in accordance with the second logic subfunction by the second logic function block. The combination of the output signals of the two logic function blocks then enables the generation of a more complex logic processing of the two data signals with additional data signals.

In accordance with a preferred configuration of the invention, a second logic decomposition unit is provided, the control input of which is coupled to a sixth data signal input of the data signal inputs, the first data input of which is coupled to a seventh data signal input of the data signal inputs and the second data input of which is coupled to an eighth data signal input of the data signal inputs. A logic basic cell in accordance with the configuration described thus has at least eight data signal inputs.

A logic basic cell in accordance with this development thus contains an additional second logic decomposition unit that can be electrically decoupled from the remaining components of the logic basic cell. The second logic decomposition unit forms a free resource which (depending on the interconnection, for example using the output signal of the first logic decomposition unit or using signals which are provided to the logic decomposition unit from other logic basic cells of the logic basic cell arrangement according to the invention) can be used for arbitrary logic tasks in a user-defined manner.

One aspect of the invention is the coupling of two logic function blocks and the first logic decomposition unit of a first logic basic cell to a second logic decomposition unit of a second logic basic cell.

Logic functions of arbitrary complexity can be constructed with only little additional outlay. Combinatorial resources that are not used or not necessary for realizing a logic overall function remain free and can be allocated to other functions. In other words, the interconnection of logic basic cells in order to form a logic basic cell arrangement makes it possible for such components of the logic basic cells which are not required for a specific application not to be left unexploited and unutilized but rather to be concomitantly used for other functions of a circuit. This enables an optimum utilizability of the resources of a logic circuit. Consequently, a very good capacity utilization of the logic combinatorics is achieved in conjunction with very high scalability.

To put it another way, the logic basic cell is constructed from the interconnected two logic function blocks and the first logic decomposition unit, on the one hand, and also the second logic decomposition unit, on the other hand. These two subblocks of the logic basic cell may be provided such that they are electrically insulated from one another. As seen from its external consideration, the logic basic cell has a multiplicity of data inputs which are provided as inputs of the logic function blocks and of the logic decomposition unit.

Furthermore, the logic basic cell has at least four, preferably exactly four, independent combinatorial outputs and two combinatorial outputs that are negated with respect to two independent combinatorial outputs, and at least one sequential output. The four independent combinatorial outputs correspond to the outputs of the two logic decomposition units and the outputs of the logic function blocks. The negated combinatorial outputs are the additional negated outputs of the logic decomposition units. The sequential output may optionally be one of the six combinatorial outputs that have been delayed in a register by a clock cycle. Of course, instead of one register it is also possible to use two, three, four, five or six registers which can be occupied by the combinatorial output signals in any desired manner.

Therefore, a universally usable component has clearly been created, which is merely fed data signals to be processed externally, which is defined in accordance with the interconnection within the logic basic cell and between a plurality of logic basic cells of a logic basic cell arrangement.

One important aspect of the invention may be seen in the fact that a (free) logic decomposition unit of a logic basic cell can be used jointly with logic blocks from other logic basic cells, whereby the logic complexity that can be achieved is increased. Other components of the logic basic cell of the logic decomposition unit connected up in this way can then be incorporated into other logic functions, so that a high degree of design freedom is combined with an efficient and space-saving utilization of the resources of the logic basic cell.

At least one of the logic function blocks of the logic basic cell may have a first signal path having a plurality of transistors of a first conduction type, the signal path being coupled to at least a portion of the data signal inputs of the respective logic function block, it being possible for the transistors to be connected up to one another in such a way that they realize the logic subfunction which can be realized by the respective logic function block from all the possible logic subfunctions for combining the data signals present at the respective logic function block, so that an output signal representing the result of the logic subfunction is provided. Furthermore, at least one of the logic function blocks may have a second signal path having a plurality of transistors of a second conduction type complementary to the first conduction type, the signal path being coupled to at least a portion of the data signal inputs of the respective logic function block, it being possible for the transistors to be connected up to one another in such a way that they realize an inverse logic subfunction with respect to that of the transistors of the first signal path from all the possible logic subfunctions for logically combining the two data signals, so that an output signal representing the result of the logic subfunction is provided.

In accordance with this configuration, a universally configurable logic cell is used for a logic function block, by means of which logic cell data signals which can be provided at the data signal inputs can be combined with one another in accordance with a predeterminable logic function. The transistors of the first conduction type (for example n-MOS transistors or p-MOS transistors) and the transistors of the second conduction type (for example p-MOS transistors or n-MOS transistors) may be realized e.g. using CMOS technology. In the case of this configuration of the logic function blocks, neither look-up tables nor gate arrangements are necessary for realizing an arbitrary logic basic function. With the transistor network which is thereby provided and is formed from the two signal paths with mutually complementary transistor types, it is possible, by means of predetermining the interconnection of the transistors, to realize any arbitrary logic function of all the possible logic functions for the respective number of input signals. Mathematically, the product terms of a logic function that result from the Boolean logic may be formed as series paths of the n-channel transistors or p-channel transistors. In each case mutually exclusive product terms can be combined using a switch. This configuration of the logic function blocks is distinguished by high interference immunity. Furthermore, only a small chip area is necessary for realizing the logic operation, and this is in conjunction with a very low power loss and a high switching speed. Moreover, high interference immunity and flexible scalability for an arbitrary number of data inputs and data outputs are made possible.

In accordance with one configuration of the invention, at least one of the logic function blocks may be formed in the structure of a programmable logic device (PLD), a field-programmable gate array (FPGA), a mask-programmed application-specific integrated circuit (mASIC), as a logic gate or an arrangement of a plurality of logic gates or as a look-up table. According to the invention, it is possible, in principle, to choose any desired configuration for the logic function blocks. In the case of the configuration of a logic function block as a look-up table, it is possible, by way of example, to implement the architecture disclosed in [1] in the logic basic cell of the invention. In the case of the realization of a logic function block as a mask-programmed application-specific integrated circuit or as "structured ASIC", it is possible to realize a desired logic subfunction of a logic function block by means of the hardwiring of transistors within the logic function block.

In other words, using vias or other coupling elements, it is possible to select a specific signal path or a plurality of signal paths within the transistor arrangement of such a "structured ASIC", whereby a fixed logic function is assigned to the logic function block.

The logic subfunction which can be realized may be predetermined for the respective logic function block in an invariable fashion at the at least one logic function configuration input. In accordance with this configuration, the logic function block always fulfills the logic subfunction that is fixedly and invariably allocated to it since the logic subfunction is fixedly set by means of the application of predetermined signals (or operating voltages) at the logic configuration inputs. The predetermined logic subfunction may also be realized in a hardwired fashion by means of short-circuiting or corresponding hardware coupling of the transistors of the logic function block. Predetermined electrical potentials (e.g. operating voltage, ground potential) can then be applied via one or a plurality of terminals of the logic function block to the transistors that are connected up to one another in a defined manner.

In the case of a fixedly predetermined logic subfunction of a logic function block, a storage device coupled to the at least one logic function configuration input may be provided, in which storage device the information for predetermining the logic subfunction which can be realized can be stored. Consequently, such a storage device can store a data word in which the logic subfunction of the logic function block is coded, for example as a binary data word.

As an alternative to the configuration described, the logic subfunction which can be realized may be predetermined for the respective logic function block in a variable fashion by means of a signal which can be applied at the at least one logic function configuration input. In the case of this configuration of a logic function block, the latter can implement any desired logic function which is predetermined for the logic basic cell by means of an electrical potential that is variable (for example with respect to time) at control inputs of transistors within the logic function block. In this scenario, the logic function block can be connected up as a variable logic component in the superordinate logic basic cell or the logic basic cell arrangement that is superordinate thereto, which enables a flexible circuit architecture.

The logic basic cell is preferably set up for processing digital data signals which have a logic value "1" or "0".

Furthermore, the logic basic cell may be provided with at least one register which is connected downstream of the first and second logic function blocks and the first and second logic decomposition unit and serves for tapping off signals which are provided at outputs of the logic basic cell. In order to enable signals to be applied externally to the logic basic cell or signals to be tapped off externally from the logic basic cell, a register (for example using flip-flops) is preferably connected downstream of the outputs of the logic decomposition unit, thereby clearly creating a register-to-register path between input signals and output signals, whereby a standardized circuit design is facilitated.

The logic basic cell arrangement having logic basic cells is described in more detail below. Configurations of the logic basic cell also hold true for the logic basic cell arrangement having logic basic cells, and vice versa.

In the case of the logic basic cell arrangement, the output of the first logic decomposition unit of a first logic basic cell is preferably coupled to the first data input of the second logic decomposition unit of a second logic basic cell. Furthermore, the output of the first logic decomposition unit of a third logic basic cell may be coupled to the second data input of the second logic decomposition unit of the second logic basic cell.

In accordance with this configuration, a logic function of four variables can be processed using logic function blocks together with a first logic decomposition unit of two logic basic cells and a second logic decomposition unit of a third logic basic cell. Each logic function block within the first and second logic basic cells can process a function of two variables, a processing of a logic subfunction of three variables being made possible by means of further processing of the output signals of the two logic function blocks by means of the associated first logic decomposition unit in each of the first and second logic basic cells in accordance with equation (2). In accordance with the interconnection described, the output signals of the function of in each case three variables of the first and second logic basic cells are brought together in the data inputs of the second logic decomposition unit of the third logic basic cell, so that a logic function of at least four variables can be processed. This arrangement of the first to third logic basic cells may be interpreted as a basis structure of a logic basic cell arrangement, it being possible for a plurality of such basis structures in turn to be connected up to one another in order to combine even more complex logic functions, i.e. logic functions with five or more data signals, with one another.

At least one data input of the second logic decomposition unit of the first and/or of the third logic basic cell may be free of a coupling to other logic cells. Furthermore, the first and/or the second logic function block and/or the first logic decomposition unit of the second logic basic cell may be free of a coupling to other logic basic cells. At least a portion of the at least one logic function block and/or of the logic decomposition unit free of a coupling to other logic basic cells may be connected up to an additional circuit in such a way that this at least one component can contribute to the functionality of the additional circuit. That is to say that of the first and second and third logic basic cells, in each case only a portion of the components can be used for implementing the intended logic function, whereas the remaining resources are not required for the logic function and are therefore made available for other applications. To put it another way, for combining the output signals of the first logic decomposition units of the first and second logic basic cell, it is possible to use a free second logic decomposition unit of a third logic basic cell, the remaining blocks of which remain free of a logic functionality. The second logic decomposition units of the first and second logic basic cells likewise remain free of a logic function in the context of the logic basic cell arrangement and can be used for other applications. Improved or optimized utilization of resources is thereby made possible.

The logic basic cell and the logic basic cell arrangement may be realized as an integrated circuit.

One aspect of the invention may be seen in the fact that a logic basic cell is set up or connected up in such a way that it implements the Shannon decomposition described above with reference to equation (2), but supplemented by at least one additional decomposition (e.g. an iterative decomposition or a disjoint decomposition), with the result that the flexibility of the basic cell according to the invention is significantly increased by the addition of at least one additional decomposition.

An uninterrupted partitionability of a logic function of n inputs is made possible with the at least two decompositions that are made possible in the basic cell according to the invention, namely with the Shannon decomposition and at least one additional decomposition. If a function of n inputs (i.e. a function that depends on n data signals to be combined in accordance with a predeterminable logic function, e.g. AND combination) can be realized in a basis cell, it is possible according to the invention to realize a function of at least (n+1) inputs with two basis cells and a function of at least (n+i) inputs with $2^i$ basis cells. A basis cell is configured in such a way that its combinatorics are likewise scaled. A basic cell having a combinatorial function of n inputs can be constructed from two function blocks of (n−1) inputs, it being possible for these subfunctions also to be available individually. In this way, logic functions of arbitrary complexity can be constructed virtually without any additional outlay. Unused combinatorial resources remain free and can be allocated to other functions. The invention enables virtually an optimum capacity utilization of the combinatorics of a logic cell array. Combinatorics and registers of a cell can be used jointly, but also wholly independently of one another, which further increases the flexibility of the cell according to the invention.

One aspect of the invention is based on the decomposition of logic functions. Such a decomposition may be realized in an sASIC basic cell with maximum flexibility in the construction of logically complex functions.

In order to realize a logic function, that is to say in order to implement a logic combination of n data signals for forming an output signal, according to the invention a decomposition of the logic function into a plurality of simpler logic subfunctions with a lower degree of complexity is performed such that the composition of the logic subfunctions as a whole realizes the logic function. The manner of the decomposition comprises, according to the invention, not only the Shannon decomposition in accordance with equation (1), but at least one additional decomposition which is more favorable than the Shannon decomposition for the realization of some logic functions. Depending on the logic function that is to be realized in the specific case of application, it is then possible to resort selectively to the resources of the Shannon decomposition unit and/or the unit for realizing the at least one additional decomposition, depending on whether e.g. a particularly space-saving or a particularly fast or resource-preserving configuration is striven for.

The logic basic cell according to the invention is provided with a Shannon decomposition unit which can be used to reduce a function f of n+1 variables into two subfunctions $f_1$ and $f_0$ which in each case depend only on n variables. This principle corresponds to equation (1) in mathematical notation.

The two functions $f_1$, $f_0$ can be interpreted as a mapping $IB_n \rightarrow IB$ since their definition range has the dimensionality n.

The Shannon decomposition, which, according to the invention, is realized by means of the Shannon decomposition unit, provides a solution for the general case which can be applied at any time and enables a complex logic function of n+1 variables to be reduced to a plurality of logic subfunctions with a smaller number of variables. If however—as in accordance with the prior art—only the Shannon decomposition were offered as sole decomposition in a logic basic cell, it may happen for specific applications that a sufficiently short gate transit time or a sufficiently small number of gates is not made possible. Such a short gate transit time or a minimal number of gates is advantageous, however, in specific applications. The Shannon decomposition alone, however, yields circuits having the depth O(n) and may accordingly yield suboptimum results in many cases.

For this reason, the invention provides the logic basic cell not only with a Shannon decomposition unit for realizing the Shannon decomposition described above, but additionally with at least one unit for realizing an additional decomposition of a logic function into a plurality of logic subfunctions. Depending on whether e.g. the gate transit time is intended to be minimized or whether the number of gates required is intended to be minimized, e.g. an iterative decomposition or a disjoint decomposition may be used as additional decomposition. However, any other mathematical decomposition by means of which a logic function can be reduced to less complex logic functions is also possible.

The iterative decomposition can be represented by equation (3):

$$f: IB^{n+1} \rightarrow IB: f(a_n, a_{n-1}, \ldots, a_1, a_0) = f_0(f_1(Q), R) \quad (3)$$

where:

$$Q, R \subseteq (a_n, a_{n-1}, \ldots, a_1, a_0) \wedge Q \cap R = 0 \quad (4)$$

In equations (3), (4), f represents a function of n+1 variables $a_n, a_{n-1}, \ldots, a_0$ which is reduced to a function $f_0$, which in turn depends on a function $f_1(Q)$ and on R. Q and R are in each case sets, each of which has one or a plurality of the variables $a_i$ where $i=0, 1 \ldots, n$ as elements.

The following relationship holds true:

$$f_0: IB^{|R|+1} \rightarrow IB \text{ und } f_1: IB^{|Q|} \rightarrow IB \quad (5)$$

The recursive application of the iterative decomposition clearly yields circuits having a pipeline-like structure and, given a depth of O(n), requires only n gates. The iterative decomposition capability is not a general property of a Boolean function.

In a circuitry realization, an iterative decomposition may be realized by virtue of the fact that an output of a logic function block in which a first logic subfunction is realized is coupled for example to the input of a multiplexer, the output of which may then be coupled to a second logic function block. In this case, the second input of the multiplexer leads to a data input and the third input of the multiplexer controls the selection between the data signal input and the output of the first logic function block. Using the iterative decomposition, it is possible, in particular, to keep down the number of gates required.

The invention's combination of iterative decomposition with Shannon decomposition ensures that even in a scenario in which a logic function is not accessible to an iterative decomposition or for which an iterative decomposition is not desired or is not advantageous, a realization which is always possible can be effected in any event by means of the Shannon decomposition.

A description is given below, with reference to equations (6), (7), of a disjoint decomposition as a further example of a decomposition which can be realized in addition to the Shannon decomposition in the logic basic cell according to the invention. The disjoint decomposition is based on the decomposition in accordance with equation (6):

$$f: IB^{n+1} \rightarrow IB: f(a_n, a_{n-1}, \ldots, a_1, a_0) = f_0(f_1(Q_1), f_2(Q_2)) \quad (6)$$

where $$Q_1 \cup Q_2 = (a_n, a_{n-1}, \ldots, a_1, a_0) \wedge Q_1 \cap Q_2 = 0 \quad (7)$$

In the case of the disjoint decomposition, a function f of n+1 variables $a_i$ is reduced to a function $f_0$, which depends on less complex subfunctions $f_1$, $f_2$, where $f_1$ depends on one subset of the variables $a_i$ and $f_2$ depends on another subset of the variables $a_i$.

If the disjointness is not assumed, then any Boolean function can be decomposed in accordance with (6), (7). The requirement of disjointness makes it possible, however, to construct circuits having the depth O(log n), which leads to a particularly short gate transit time.

Clearly, the invention's architecture of the logic basic cell makes use of the concept that with the provision of a Shannon decomposition and at least one other additional decomposition (in particular a disjoint decomposition and/or an iterative decomposition), the flexibility in the circuit design can be significantly increased, and parameters such as gate transit time and number of gates can be optimized. It is possible to reuse complete logic functions or individual parts thereof in other logic functions, for which reason every combinatorial path in a logic basic cell can be provided as an output thereof. By means of a structural multiplexer, an arbitrary combinatorial path within a basic cell can be connected to the input of a cell-internal register. In order to be able to operate registers and combinatorics independently of one another, it is possible to provide a combinatorial dummy path to the register, which can be switched via the same structural multiplexer. In this way, it is possible e.g. to connect the registers of adjacent cells to form a shift register without taking up the combinatorial resources of the cells involved.

The at least one additional decomposition in the logic basic cell may be an iterative decomposition. This circuitry realization is based in particular on the mathematical representation of equations (4), (5).

In the case of the at least one unit for realizing an additional decomposition, the iterative decomposition may be realized by means of a first logic function block, having at least two data signal inputs, to which at least two input signals can be applied, and having a data signal output for providing a logic combination of the at least two input signals in accordance with a predeterminable logic subfunction. Furthermore, the at least one unit for realizing an additional decomposition may realize the iterative decomposition by means of a multiplexer, having a first and having a second data signal input and having a data signal output, the data signal output of the first logic function block being coupled to the first data signal input of the multiplexer, and it being possible for an additional input signal to be provided at the second data signal input of the multiplexer. The described configuration of the logic basic cell with an iterative decomposition that is realized clearly has a pipeline-like structure comprising the logic function block and the multiplexer connected downstream, whereby a circuitry realization of equations (4), (5) is created.

The at least one additional decomposition may be a disjoint decomposition. This circuitry realization is based in particular on the mathematical representation of equations (6), (7).

A circuitry realization of the disjoint decomposition can be realized by means of a second logic function block, a third logic function block and a fourth logic function block, the second logic function block realizing a first logic subfunction of at least two input signals, the third logic function block realizing a second logic subfunction of at least two of the input signals, and the fourth logic function block realizing a logic combination of the output signals of the second and of the third logic function block.

By virtue of the fact that the output signals of two logic function blocks, in which a logic subfunction is in each case realized, are combined by using once again a logic function block rather than a pure multiplexer, it is possible to realize the combination in accordance with (6), (7).

The at least one unit for realizing an additional decomposition may realize a disjoint decomposition by means of a multiple function device that selectively realizes a multiplex functionality of at least two input signals or the functionality of forming a logic subfunction of at least two input signals. By way of example, the fourth logic function block, in accordance with the configuration described above, may be realized as such a multiple function device which can be switched between a first application as multiplexer and a second application as logic cell.

The Shannon decomposition unit may realize the Shannon decomposition by means of a fifth logic function block, by means of a sixth logic function block and by means of a multiplexer, the fifth logic function block realizing a first logic subfunction of at least two input signals, the sixth logic function block realizing a second logic subfunction of at least two input signals, and the multiplexer combining the output signals of the two logic function blocks with one another and with an additional input signal.

With this circuitry configuration, the Shannon decomposition described on the basis of equation (1) can be implemented according to the invention.

Preferably, in the case of the logic basic cell, the at least one unit for realizing an additional decomposition is set up for realizing an iterative decomposition and a disjoint decomposition, i.e. for realizing both of the decompositions. In accordance with this configuration, a particularly high degree of flexibility is achieved by virtue of the fact that, in addition to the Shannon decomposition, both an iterative decomposition and a disjoint decomposition are supported by the logic basic cell according to the invention, so that, as required, a short gate transit time or a small number of gates is possible for the realization of a specific logic function, and any desired logic function can nevertheless be realized by a logic basic cell configured in this way.

In the case of the logic basic cell, it is possible to make a changeover between the multiplexer and the multiple function device by means of an invariable hardware element and the function of the multiple function device may likewise be realized by an invariable hardware element. It is thus possible to select between the multiplexer and the multiple function device by means of an invariable hardware element. By providing components of the logic basic cell as invariable hardware elements, it is possible to realize static multiplexers as structural multiplexers, whereby transistors can be saved and the necessary chip area for forming the logic basic cell is reduced. In particular, a multiplexer and/or the multiple function device may be realized in a fixedly predeterminable fashion by means of a plurality of metallization planes and/or by means of vias.

The logic basic cell may be set up as an application-specific integrated circuit, and may be set up in particular as a programmable logic device (PLD), as a field-programmable gate array (FPGA) or as a mask-programmed application-specific integrated circuit.

The logic basic cell of the invention may also be realized as a CMOS logic basic cell.

Each of the logic function blocks of the logic basic cell according to the invention is preferably set up in such a way that it realizes a predetermined logic function. This may be realized e.g. by providing each of the logic function blocks as a logic gate or an arrangement of a plurality of logic gates, or as a look-up table.

The logic subfunction which can be realized by a respective logic function block may be predetermined for the logic function block in an invariable fashion at at least one logic function configuration input of the logic basic cell according to the invention. In accordance with this configuration, the logic of a respective logic function block is fixedly set, i.e. adjusted for example by means of constant control signals, so that transistors contained in the logic function block, by way of example, are switched in a very specific manner, so that only specific data paths are enabled within the logic function block and the logic function striven for is thereby realized.

As an alternative to the configuration described, in the case of the logic basic cell, the logic subfunction which can be realized may be predetermined for the respective logic function block in a variable fashion by means of a signal which can be applied at at least one logic function configuration input. In this case, the transistor gates in a logic function block may be driven for example by virtue of the fact that variable electrical signals are provided at logic function configuration inputs, so that, in accordance with a logic that can be specifically set, only specific paths within the logic function block are enabled, which enables a realization of a predeterminable logic function.

The configurations described with reference to the logic basic cell according to the invention also hold true for the logic basic cell arrangement having a plurality of logic basic cells.

BRIEF DESCRIPTION OF THE DRAWINGS

Exemplary embodiments of the invention are illustrated in the figures and are explained in more detail below.

In the figures:

FIG. 4 shows a logic basic cell in accordance with a first exemplary embodiment of the invention;

FIG. 5 shows a logic basic cell in accordance with a second exemplary embodiment of the invention;

FIG. 10 shows a logic basic cell according to the invention, which illustrates that the first and the second logic decomposition unit can realize a respective decomposition in an arbitrarily interchangeable fashion.

DETAILED DESCRIPTION OF PREFERRED EMBODIMENTS OF THE INVENTION

Figure 1:
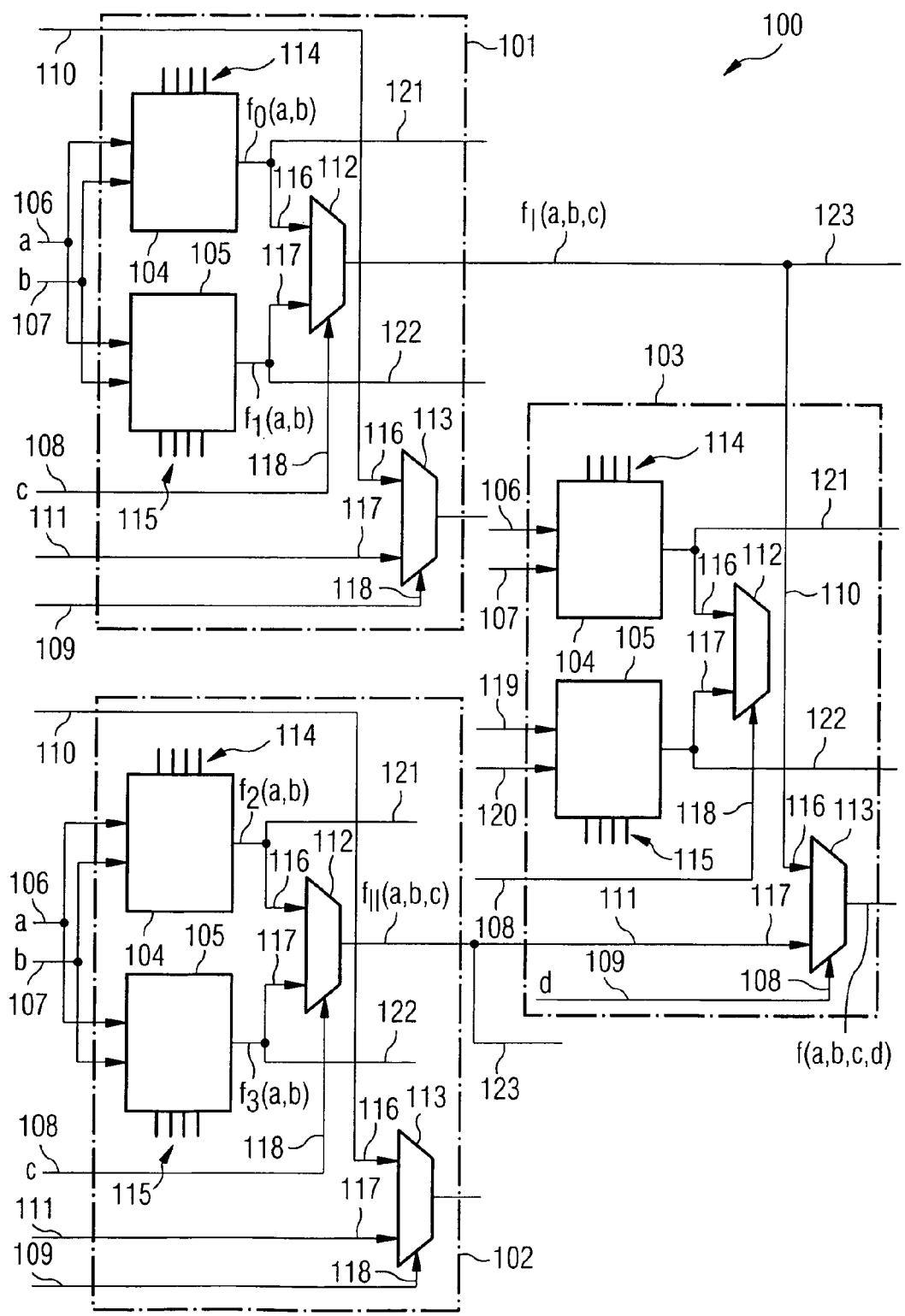
FIG. 1 shows a logic basic cell arrangement in accordance with a first exemplary embodiment of the invention.

Identical or similar components in different figures are provided with identical reference numerals.

The illustrations in the figures are schematic and not to scale.

A description is given below, with reference to FIG. 1, of a logic basic cell arrangement 100 in accordance with a first exemplary embodiment of the invention.

The logic basic cell arrangement is formed from a first logic basic cell 101, a second logic basic cell 102 and a third logic basic cell 103, which are connected up to one another in the manner shown in FIG. 1.

The first logic basic cell 101 contains first to sixth data signal inputs 106 to 111, a data signal a being provided at the first data signal input 106, a second data signal b being provided at a second data signal input 107 and a data signal c being provided at a third data signal input 108. The fourth to sixth data inputs 109 to 111 are free of a data signal in accordance with FIG. 1.

Furthermore, the first logic basic cell 101 contains a first logic function block 104 and a second logic function block 105, each of which is coupled to the first data signal input 106 and to the second data signal input 107. Each of the logic function blocks 104, 105 is provided with four logic function configuration inputs 114, 115, which can be used to select a logic subfunction which can be realized by a respective logic function block 104, 105 from a plurality of logic subfunctions which can be realized for combining the data signals a, b. This logic subfunction that is realized is coded in first to fourth logic configuration signals cfg0, cfg1, cfg2, cfg3, in which case, in accordance with the exemplary embodiment described, the logic configuration signals provided at the logic function configuration inputs 114 are different from those which are provided at the logic function configuration inputs 115.

Furthermore, a first multiplexer 112 is provided, the first data input 116 of which is coupled to an output of the first logic function block 104, the second data input 117 of which is coupled to an output of the second logic function block 105 and the control input 118 of which is coupled to the third data signal input 108, by means of which the third data signal c is applied to the control input 118.

Furthermore, a second multiplexer 113 is provided, the control input 118 of which is coupled to the fourth data signal input 109, the first data input 116 of which is coupled to the fifth data signal input 110 and the second data input 117 of which is coupled to the sixth data signal input 111.

As shown in FIG. 1, the internal construction, that is to say the structure, of the second logic basic cell 102 is essentially identical to the internal construction of the first logic basic cell 101. However, the internal construction of different logic basic cells of a logic basic cell arrangement according to the invention may also be different in departure from FIG. 1. Thus, by way of example, in the case of the third logic basic cell 103, two separate data signal inputs are in each case provided for the two logic function blocks 104, 105. The first logic function block 104 has first and second data signal inputs 106, 107, whereas the second logic function block 105 has seventh and eighth data signal inputs 119, 120. To put it another way, different signals can be provided at the first and second data signal input pairs 106, 107 and 119, 120.

As is furthermore shown in FIG. 1, the signals applied to the inputs of the different logic basic cells 101 to 103 are different, which is essential to the functionality of the logic basic cell arrangement 100.

The interconnection of the logic basic cells 101 to 103 with one another is described below.

The output of the first multiplexer 112 of the first logic basic cell 101 is coupled to the first data signal input 116 of the second multiplexer 113 of the third logic basic cell 103. Furthermore, the output of the first multiplexer 112 of the second logic basic cell 102 is coupled to the second data input 117 of the second multiplexer 113 of the third logic basic cell 103.

In accordance with the operating state of the logic basic cell arrangement 100 as shown in FIG. 1, a signal a is in each case applied to the respective first data signal inputs 106 of the first and second logic basic cells 101, 102. In accordance with FIG. 1, a second data signal b is applied to the second data signal input 107 of the first and second logic basic cells 101, 102. A third data signal c is in each case applied to the third data signal input 108 of the first and second logic basic cells 101, 102. The fourth to sixth data signal inputs 109 to 111, which are coupled to the second multiplexers 113 of the first and second logic basic cells 101, 102, are free of signals in the operating state shown. The multiplexers 113 of the first and second logic basic cells 101, 102 are not used in the case of the operating state shown in FIG. 1, so that they represent resources which can be used for other logic operations required on a circuit.

In contrast thereto, in the case of the third logic basic cell, the first to third and also the seventh and eighth data signal inputs 106 to 108, 119, 120 are free of a data signal. No signals are applied to the first and second logic function configuration inputs 114, 115 of the third logic basic cell 103. In other words, the logic function blocks 104, 105 and also the first multiplexer 112 of the third logic basic cell 103 are not used in accordance with the operating state of FIG. 1, so that these are available as resources for other tasks to be implemented on a circuit. In the third logic basic cell 103, only the second multiplexer 113 is crucial for the functionality of the logic basic cell 100, by means of which second multiplexer output signals of the first multiplexers 112 of the first and second logic basic cells 101, 102 are processed further. A fourth data signal d is applied to the control input 108 of the second multiplexer 113 of the third logic basic cell 103.

The functionality of the logic basic cell arrangement 100 shown in FIG. 1 is described below.

The logic basic cell arrangement 100 performs a logic combination of the four data signals a, b, c, d to form a logic overall function f(d, c, b, a) in accordance with the following equation:

$$f(d, \; c, \; b, \; a) = \overline{d} \cdot (\overline{c} \cdot f_0(b, \; a) \wedge c \cdot f_1(b, \; a)) \wedge d \cdot (\overline{c} \cdot f_2(b, \; a) \vee c \cdot f_3(b, \; a)) \quad (8)$$

The logic operation $f_0$ to $f_3$ implemented by the respective logic function block 104, 105 is predetermined by means of the application of the logic function signals cfg0, cfg1, cfg2, cfg3 to the first and second logic configuration inputs 114, 115 of a respective logic function block 104, 105. In other words, the configuration information cfg0, cfg1, cfg2, cfg3 forms a data word by means of which any desired logic operation of all conceivable logic operations for the combination of two data signals a, b can be performed by each of the logic function blocks 104, 105.

In a departure from the exemplary embodiment shown in FIG. 1, it is also possible for a different number of configuration bits to be applied to the logic function blocks 104, 105. Moreover, different configuration bits can be applied to different logic function blocks 104, 105 of a logic basic cell or to different logic basic cells and different logic functions can thus be selected.

In accordance with the exemplary embodiment shown in FIG. 1, in the first logic function block 104 of the first logic basic cell 101, a logic combination $f_0(a,b)$ of the two input signals a, b is implemented and the result of this logic operation is fed to the first data input 116 of the first multiplexer 112 of the first logic basic cell 101. In a similar manner, in accordance with the functionality of the second logic function block 105, the first data signal a and the second data signal b are combined with one another in such a way that a logic result $f_1(a,b)$ is provided at the output of the second logic function block 105 of the first logic basic cell 101. By means of the functionality of the first multiplexer 112 of the first logic basic cell 101, the two logic subfunctions $f_0$, $f_1$, using the third data signal c provided at the control input 118 of the first multiplexer 112, are subjected to a logic combination such that the logic subfunction $f_I(a, b, c)$ is provided at the output of the first multiplexer 112.

At a first tapping output 121 (which may also be referred to as first data signal output), it is possible to tap off a signal at the output of the respective first logic function block 104 of a respective logic basic cell 101 to 103. At a second tapping output 122 (which may also be referred to as second data signal output), it is possible to tap off a signal at the output of the respective second logic function block 105 of a respective logic basic cell 101 to 103. Furthermore, at a third tapping output 123 (which may also be referred to as third data signal output), it is possible to tap off a signal at the output of the respective first multiplexer 112 of a respective logic basic cell 101 to 103.

In a similar manner, on the basis of the functionality of the first and second logic function blocks 104, 105 of the second logic basic cell 102, logic subfunctions $f_2$, $f_3$ are provided at the outputs thereof and fed to the data inputs 116, 117 of the first multiplexer 112 of the second logic basic cell 102. Using the third data signal c at the control input 118 of the first multiplexer 112 of the second logic basic cell, the logic subfunctions $f_2$, $f_3$ are logically combined with one another in such a way that a logic subfunction $f_{II}(a, b, c)$ is provided at the output of the multiplexer 112.

The logic subfunction $f_I$ clearly represents the expression in brackets of the first term in equation (8), whereas $f_{II}$ represents the expression in brackets of the second term in equation (8). Using the fourth data signal d, which is provided at the control input 108 of the second multiplexer 113 of the third logic basic cell 103, the logic subfunctions $f_I$ and $f_{II}$ are combined with one another in such a way that the logic overall signal f(a, b, c, d) in accordance with equation (8) is provided at the output of the second multiplexer 113 of the third logic basic cell 103.

It should be noted that, in departure from the interconnection shown in FIG. 1, it is also possible as an alternative that the formation of the overall function f(a, b, c, d) from the subfunctions $f_I(a, b, c)$ and $f_{II}(a, b, c)$ and also from the data signal d does not have to be effected using the two logic basic cells 101, 102 and the free second multiplexer 113 of the third logic basic cell 103, rather that this logic operation can be effected using only the resources of the two logic basic cells 101, 102. In this case, the outputs of the first multiplexers 112 of the two logic basic cells 101, 102 are connected up to the two data inputs of one of the two second multiplexers 113 of one of the two logic basic cells 101, 102. The data signal d is then provided at the control input of the second multiplexer 113. With this interconnection (clearly a feedback of a logic basic cell 101, 102 to itself), it is possible for a function having the complexity (n+1) actually to be realized only using resources of precisely two logic basic cells having the complexity n whilst avoiding taking up an external second multiplexer of a different logic basic cell.

A description is given below, with reference to FIG. 2, of a logic function block 200 in accordance with a preferred exemplary embodiment of the invention.

Figure 2:
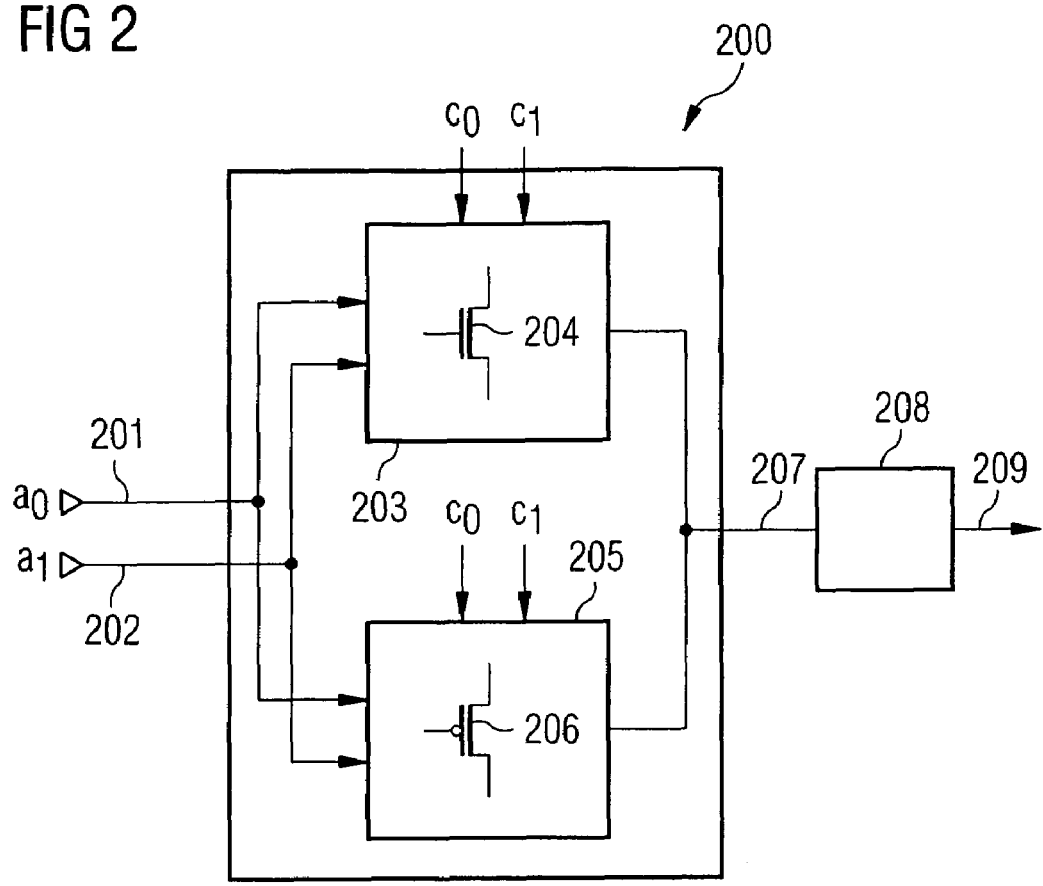
FIG. 2 shows a logic function block in accordance with a first embodiment.

It should be noted that, in departure from the logic function block 200 shown in FIG. 2, it is possible, in principle, to use any desired logic function block for the combination of two data signals $a_0$, $a_1$. The data signals $a_0$, $a_1$ from FIG. 2 clearly correspond to the data signals a, b from FIG. 1.

The first data signal input 201 from FIG. 2 essentially corresponds to the first data signal input 106 from FIG. 1, whereas the second data signal input 202 from FIG. 2 corresponds to the second data signal input 107 from FIG. 1. The global output 209 from FIG. 2 essentially corresponds to the output of a respective logic function block 104, 105.

In other words, FIG. 2 illustrates an example of the internal structure of a logic function block 104, 105.

The logic function block 200 has a first data signal input 201 and a second data signal input 202, at which two data signals $a_0$ and $a_1$, respectively, are provided. The logic function block 200 contains a first signal path unit 203 coupled to the data signal inputs 201, 202 and having a plurality of n-MOS transistors 204 (n conduction type), the n-MOS transistors 204 being connected up to one another in such a way that they realize a first logic subfunction from a plurality of logic subfunctions for the logic combination of the two data signals $a_0$, $a_1$, so that an output signal representing the result of the first logic subfunction is provided at output 207. Furthermore, the logic function block 200 contains a second signal path unit 205 coupled to the data signal inputs 201, 202 and having a plurality of p-MOS transistors 206 (of the p conduction type, which is complementary to the n conduction type). The p-MOS transistors 206 are connected up to one another in such a way that they realize a second logic subfunction from a plurality of different logic subfunctions for the logic combination of the two data signals $a_0$, $a_1$, so that an output signal representing the result of the second logic subfunction is provided at output 207, the result of the second logic subfunction being the inverse of the result of the first logic subfunction. A further processing unit 208 is connected between output 207 and a global output 209, which may be coupled to a data input 116 or 117 of a multiplexer 112 connected downstream, by means of which unit output signals can be processed further, for the purpose of providing an output signal that has been processed further at the global output 209. The output signal $f(a_0, a_1)$ is provided at the global signal output 209 of the logic function block 200, which output signal represents the logic combination of the input signals $a_0$, $a_1$ in accordance with the selected logic and has already been subjected to (optional) further processing.

As is furthermore shown in FIG. 2, the signal path units 203, 205 are in each case provided with a first logic function signal $c_0$ and a second logic function signal $c_1$, which logic function signals are provided to the respective logic function block 200, 104, 105 by means of the first and second logic function configuration inputs 114, 115 from FIG. 1. By means of predetermining these logic function signals $c_0$, $c_1$, the transistors 204 and 206 of the signal path unit 203 and 205, respectively, are driven in such a way that the signals $a_0$, $a_1$ are combined with one another by the signal path units 203 and 205 in accordance with the first logic function and the second logic function, respectively. Consequently, a very specific logic function is clearly selected by means of predetermining the logic values of the logic function signals $c_0$, $c_1$.

A description is given below of the theoretical basis based on Boolean logic which underlies the functionality of a preferred exemplary embodiment of the logic function block of the logic basic cell according to the invention.

A Boolean function can be expressed in the canonical conjunctive normal form as an OR combination of the product terms of its n inputs (in FIG. 2 for example n=2 since two input signals $a_1$, $a_0$ are provided). These n inputs are assigned $2n$ product terms.

Applied to standard CMOS logic, the product terms for the logic value "1" of a function are realized as a series path of p-channel transistors (in FIG. 2 for example: p-channel transistors 206). The logic value "0" is correspondingly realized as a series path of n-channel transistors (in FIG. 2: n-MOS transistors 204). Any logic function in accordance with which signals provided at n inputs are logically combined with one another can correspondingly be composed of $2^n$ product terms, clearly by product terms being connected in or out.

For two inputs $a_0$ and $a_1$ (as in FIG. 2), the following holds true:

$$y = k_0 \cdot \overline{a_1} \cdot \overline{a_0} \lor k_1 \cdot \overline{a_1} \cdot a_0 \lor k_2 \cdot a_1 \cdot \overline{a_0} \lor k_3 \cdot a_0 \cdot a_1 \quad (9)$$

$$\overline{y} = k_4 \cdot \overline{a_1 \cdot a_0} \lor k_5 \cdot \overline{a_1 \cdot \overline{a_0}} \lor k_6 \cdot \overline{\overline{a_1} \cdot a_0} \lor k_7 \cdot \overline{\overline{a_1} \cdot \overline{a_0}} \quad (10)$$

where $$k_i = \{0, 1\} \text{ where } i = 0, 1, \ldots 7 \quad (11)$$

Each function $y=f(a_0, a_1)$ is formed by four values of the switching coefficients or logic function variables $k_0$ to $k_7$ being set to a value of logic "1" and the rest being set to a value of logic "0". Since in CMOS logic the p-channel transistors open with an electrical potential "0" at the control or gate terminal, whereas the n-channel transistors open in the case of an electrical potential having a value "1", the product terms in equations (9), (10) can be ordered to form mutually exclusive pairs. In equations (9), (10), the respective first product terms logically exclude one another, as do the respective second product terms, the respective third product terms and the respective fourth product terms.

The following relationship holds true for the switching coefficients $k_i$:

$$k_0 = \overline{k_4}, \; k_1 = \overline{k_5}, \; k_2 = \overline{k_6}, \; k_3 = \overline{k_7} \quad (12)$$

The following results from equations (10), (11), (12) after combination to form four independent switching variables $c_0, c_1, c_2, c_3$:

$$y = \overline{c_0} \cdot \overline{a_1} \cdot \overline{a_0} \lor \overline{c_1} \cdot \overline{a_1} \cdot a_0 \lor \overline{c_2} \cdot a_1 \cdot \overline{a_0} \lor \overline{c_3} \cdot a_1 \cdot a_0 \quad (13)$$

$$\overline{y} = c_0 \cdot \overline{\overline{a_1} \cdot \overline{a_0}} \lor c_1 \cdot \overline{\overline{a_1} \cdot a_0} \lor c_2 \cdot \overline{a_1 \cdot \overline{a_0}} \lor c_3 \cdot \overline{\overline{a_1} \cdot \overline{a_0}} \quad (14)$$

where $$c_i = \{0, 1\} \text{ where } i = 0, 1, \ldots 3 \quad (15)$$

Clearly, equation (13) corresponds to the path of p-MOS transistors 206 in FIG. 2, whereas equation (14) corresponds to the path of n-MOS transistors 204 in FIG. 2. However, FIG. 2 shows only two instead of four logic function variables.

A description is given below, with reference to FIG. 3, of a semiconductor-technological realization of the function in accordance with equations (13), (14) on the basis of transistors as a possible logic function block 104, 105 for a logic basic cell 101 to 103 of the logic basic cell arrangement from FIG. 1.

Figure 3:
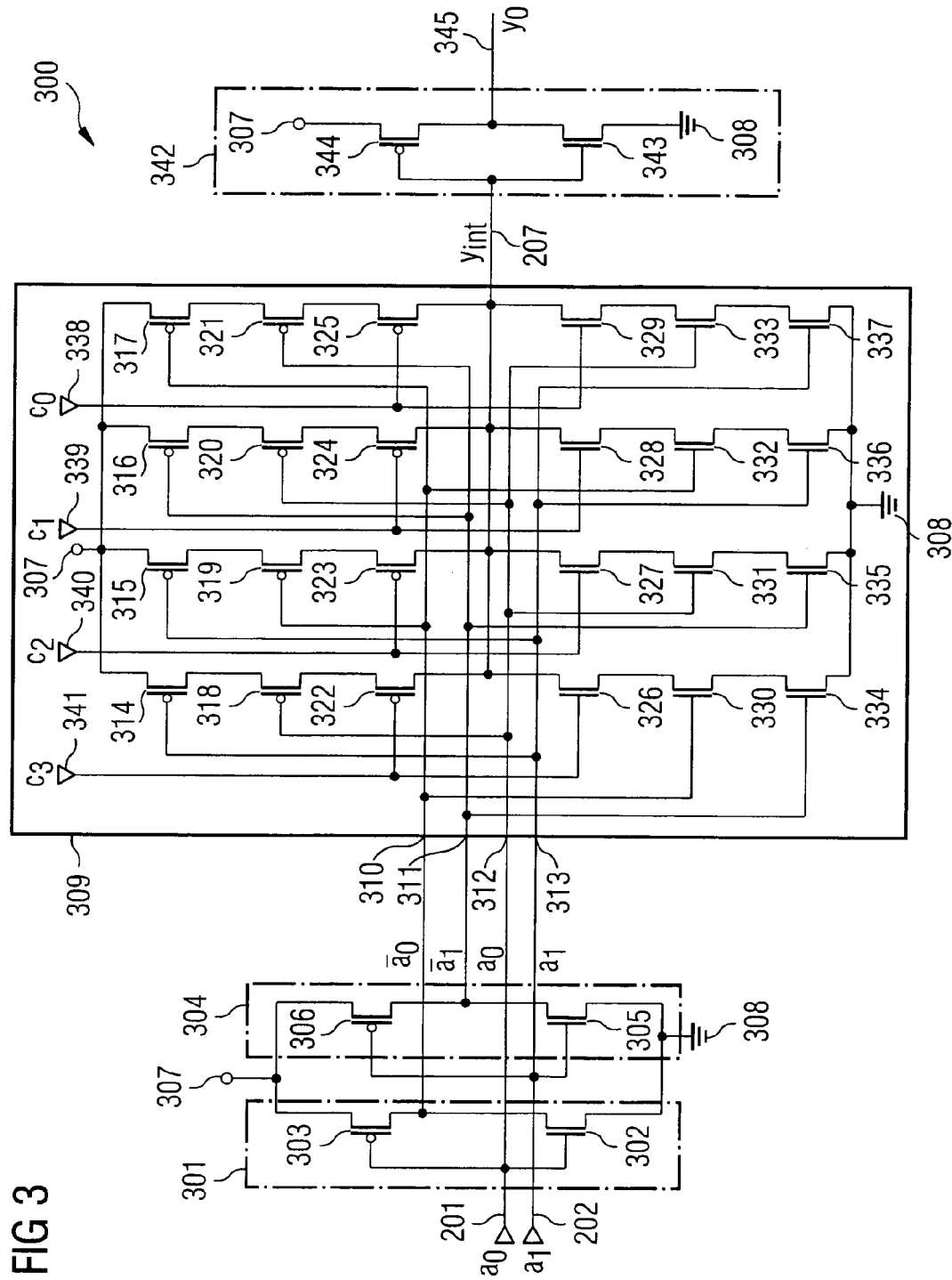
FIG. 3 shows a logic function block in accordance with a second embodiment.

In the case of the logic function block 300 from FIG. 3, a first data signal $a_0$ is provided at a first data signal input 201. Furthermore, a second data signal $a_1$ is provided at a second data signal input 202. The complementary signal $\overline{a_0}$ with respect to the first data signal $a_0$ is formed from the latter by means of a first inverter circuit 301. The first data signal input 201 is coupled to the gate region of a first n-MOS inverter transistor 302. Furthermore, the first data signal input 201 is coupled to the gate terminal of a first p-MOS inverter transistor 303. A first source/drain region of the first p-MOS inverter transistor 303 is brought to the electrical supply potential 307. The second source/drain region of the first p-MOS inverter transistor 303 is coupled to a first source/drain region of the first n-MOS inverter transistor 302, the second source/drain region of which is brought to the electrical ground potential 308.

Furthermore, a second inverter circuit 304 is provided, by means of which the logically complementary signal $\overline{a_1}$ of the second data signal $a_1$ is formed from the latter. The second data signal input 202 is coupled to the gate terminals of a second n-MOS inverter transistor 305 and of a second p-MOS inverter transistor 306, which transistors 305, 306 form the second inverter circuit 304. A first source/drain region of the second p-MOS inverter transistor 306 is coupled to the first source/drain region of the first p-MOS inverter transistor 303, whereas the second source/drain terminal of the second p-MOS inverter transistor 306 is coupled to a first source/drain terminal of the second n-MOS inverter transistor 305. The second source/drain terminal of the second n-MOS inverter transistor 305 is brought to the electrical ground potential 308.

As shown in FIG. 3, the data signals and the logically complementary values thereof are provided to a signal path unit 309. The signal $\overline{a_0}$ is provided at a first signal path input 310. The signal $\overline{a_1}$ is provided at a second signal path input 311. The signal $a_0$ is provided at a third signal path input 312. The signal $a_1$ is provided at a fourth signal path input 313.

The signal path unit 309 is formed from first to twelfth p-MOS logic transistors 314 to 325 and from first to twelfth n-MOS logic transistors 326 to 337. The first to twelfth p-MOS logic transistors 314 to 325 form a first signal path subunit, whereas the first to twelfth n-MOS logic transistors 326 to 337 form a second signal path subunit.

A first logic function signal $c_0$ is applied to a first logic function input 338. A second logic function signal $c_1$ is provided at a second logic function input 339. A third logic function signal $c_2$ is provided at a third logic function input 340. A fourth logic function signal $c_3$ is provided at a fourth logic function input 341.

The fourth logic function input 341 is coupled to the gate terminal of the ninth p-MOS logic transistor 322 and to the gate terminal of the first n-MOS logic transistor 326. The third logic function input 340 is coupled to the gate terminals of the tenth p-MOS logic transistor 323 and of the second n-MOS logic transistor 327. The second logic function input 339 is coupled to the gate terminals of the eleventh p-MOS logic transistor 324 and of the third n-MOS logic transistor 328. The first logic function input 338 is coupled to the gate terminals of the twelfth p-MOS logic transistor 325 and of the fourth n-MOS logic transistor 329.

The first data signal input 310 is coupled to the gate terminal of the fifth n-MOS logic transistor 330, of the sixth p-MOS logic transistor 319, of the seventh n-MOS logic transistor 332 and of the fourth p-MOS logic transistor 317. The second data signal input 311 is coupled to the gate terminals of the ninth n-MOS logic transistor 334, of the tenth n-MOS logic transistor 335, of the third p-MOS logic transistor 316 and of the eighth p-MOS logic transistor 321. The third data signal input 312 is coupled to the gate terminals of the fifth p-MOS logic transistor 318, of the sixth n-MOS logic transistor 331, of the seventh p-MOS logic transistor 320 and of the eighth n-MOS logic transistor 333. The fourth data signal input 313 is coupled to the gate terminals of the first p-MOS logic transistor 314, of the second p-MOS logic transistor 315, of the eleventh n-MOS logic transistor 336 and of the twelfth n-MOS logic transistor 337.

First source/drain terminals of the first to fourth p-MOS logic transistors 314 to 317 are brought to the electrical potential of the supply voltage 307. The second source/drain terminal of the first p-MOS logic transistor 314 is coupled to a first source/drain terminal of the fifth p-MOS logic transistor 318, the second source/drain terminal of which is coupled to a first source/drain terminal of the ninth p-MOS logic transistor 322. The second source/drain terminal of the second p-MOS logic transistor 315 is coupled to a first source/drain terminal of the sixth p-MOS logic transistor 319, the second source/drain terminal of which is coupled to a first source/drain terminal of the tenth p-MOS logic transistor 323. The second source/drain terminal of the third p-MOS logic transistor 316 is coupled to a first source/drain terminal of the seventh p-MOS logic transistor 320, the second source/drain terminal of which is coupled to a first source/drain terminal of the eleventh p-MOS logic transistor 324. The second source/drain terminal of the fourth p-MOS logic transistor 317 is coupled to a first source/drain terminal of the eighth p-MOS logic transistor 321, the second source/drain terminal of which is coupled to a first source/drain terminal of the twelfth p-MOS logic transistor 325.

The second source/drain terminals of the ninth to twelfth p-MOS logic transistors 322 to 325 are coupled to the output 207 and to first source/drain terminals of the first to fourth n-MOS logic transistors 326 to 329. The second source/drain terminal of the first n-MOS logic transistor 326 is coupled to a first source/drain terminal of the fifth n-MOS logic transistor 330, the second source/drain terminal of which is coupled to a first source/drain terminal of the ninth n-MOS logic transistor 334. The second source/drain terminal of the second n-MOS logic transistor 327 is coupled to a first source/drain terminal of the sixth n-MOS logic transistor 331, the second source/drain terminal of which is coupled to a first source/drain terminal of the tenth n-MOS logic transistor 335. The second source/drain terminal of the third n-MOS logic transistor 328 is coupled to a first source/drain terminal of the seventh n-MOS logic transistor 332, the second source/drain terminal of which is coupled to a first source/drain terminal of the eleventh n-MOS logic transistor 336. Furthermore, the second source/drain terminal of the fourth n-MOS logic transistor 329 is coupled to a first source/drain terminal of the eighth n-MOS logic transistor 333, the second source/drain terminal of which is coupled to a first source/drain terminal of the twelfth n-MOS logic transistor 337. The second source/drain terminals of the ninth to twelfth n-MOS logic transistors 334 to 337 are coupled to one another and brought to the electrical ground potential 308.

The output signal $y_{int}$ is provided at the output 207.

The logic inverse $y_0$ is formed from the output signal $y_{int}$ at the output 207 using a third inverter circuit 342, and is provided at a global output 345. The output signal $y_{int}$ is passed through the third inverter circuit 342, formed from a third n-MOS inverter transistor 343 and a third p-MOS inverter transistor 344. The output 207 is coupled to the gate terminals of the transistors 344, 343. A first source/drain terminal of the third p-MOS inverter transistor 344 is brought to the electrical supply potential 307. The second source/drain terminal of the third p-MOS inverter transistor 344 is coupled to a first source/drain terminal of the third n-MOS inverter transistor 343, the second source/drain terminal of which is brought to the electrical ground potential 308. The second source/drain terminal of the third p-MOS inverter transistor 344 and the first source/drain terminal of the third n-MOS inverter transistor 343 are coupled to the global output 345.

The functionality of the logic function block 300 is described below.

The signal path unit 309 clearly implements the logic operations with the input signals $\overline{a_0}$, $\overline{a_1}$, $a_0$ and $a_1$. The functionality of equation (13) is clearly implemented by the p-MOS transistors 314 to 325 connected up in the manner shown in FIG. 3, whereas the logic operation in accordance with equation (14) is clearly implemented by the n-MOS transistors 326 to 337. The two inverter circuits 301, 304 are provided between the data signal inputs 201, 202 and the signal path inputs 310 to 313 in order to generate the complementary signals $\overline{a_0}$, $\overline{a_1}$. The driving inverter circuit 342 is connected between output 207 and the global output 345. In accordance with the exemplary embodiment described, the logic function block 300 having two inputs 201, 202 requires thirty transistors, namely the twelve p-MOS logic transistors 314 to 325, the twelve n-MOS logic transistors 326 to 337 and the six transistors 302, 303, 305, 306, 343, 344. The number of configuration bits or logic function signals is four ($c_0$, $c_1$, $c_2$, $c_3$).

It should be noted that, instead of four common logic function signals $c_0$ to $c_3$, as an alternative, it is also possible for the twelve p-MOS logic transistors 314 to 325 to be operated with four separate logic function signals and for the twelve n-MOS logic transistors 326 to 337 to be operated with four separate logic function signals that are different from $c_0$ to $c_3$.

A description is given below, with reference to FIG. 4, of a logic basic cell 400 in accordance with a first exemplary embodiment of the invention.

The logic basic cell 400 is formed from first and second logic function blocks 104, 105, a first multiplexer 112 and a second multiplexer 113. The logic basic cell 400 is illustrated with first to eighth data signal inputs 401 to 408, at which data signals x0 to x7 can be provided. First and second data signals x0, x1 can be provided at data signal inputs 401, 402 of the first logic function block 104. The output of the first logic function block 104 is coupled to a first data input 116 of the first multiplexer 112 and is furthermore coupled to an input of a first register 412 of a register stage 411, which first stage 411 is connected downstream of the multiplexers 112, 113 and also the logic function blocks 104, 105. The logic signal y0 generated from a logic combination of the first and second data signals x0, x1 in accordance with the functionality of the first logic function block 104, is provided at an output as y0. Furthermore, after passing through the first register 412, it is provided at an output of the register 412 as yreg0 and can thus be tapped off. The signal y0 can be processed further as desired.

The second data signal input 117 of the first multiplexer 112 is coupled to an output of the second logic function block 105, so that the logic combination of third and fourth data signals x2, x3 provided to the second logic function block 105 at third and fourth data signal inputs 403, 404 can be tapped off at the second data input 117. The output signals of the first and second logic function blocks 104, 105 are logically combined using the first multiplexer 112, to which a fifth data signal x4 is provided at a control input 118 via a fifth data signal input 405. The resultant logic signal at the output of the first multiplexer 112 is provided directly as signal y1 and is fed independently thereof to a second register 413, at the output of which the signal can be tapped off as yreg1. Furthermore, the logic result at the output of the second logic function block 105 is provided directly as signal y2 for further processing or further use and on the other hand, after passing through a third register 414, is provided at the output thereof as yreg2.

By means of a second multiplexer 113, which is electrically decoupled from the first multiplexer 112 and also the logic function blocks 104, 105, sixth to eighth data signals x5 to x7, which are provided at the data inputs 116, 117 and at the control input 118, respectively, of the second multiplexer 113 via sixth to eighth data signal inputs 406 to 408, can be logically processed in the second multiplexer 113. The result of this logic processing can on the one hand be tapped off directly as logic signal y3 and can on the other hand be tapped off as yreg3 after passing through a fourth register 415. The first to fourth registers 412 to 415 are clocked by means of a clock signal clk provided at a clock input 416.

The functionality of the logic basic cell 400 shown in FIG. 4 is explained below.

The logic function $f_0$ realized in the first logic function block 104 and also the logic function $f_1$ realized in the second logic function block 105 can be implemented by means of look-up tables or other realizations. The concrete function $f_0$ and $f_1$ is determined by means of the four-bit configuration words cfg0 and cfg1 provided at first and second logic function configuration inputs 409, 410 of the first and second logic function blocks 104, 105, respectively.

Using the boundary conditions x0=x2=a and x1=x3=b and also x4=c, the three-valued function y=f(c, b, a) is realized at the first multiplexer 112. Nevertheless, the two subfunctions $f_0$ and $f_1$ remain able to tapped off as $y_0$ and $y_1$ at the output of the logic basic cell 400 and can be used for further combination with other logic inputs in another basis cell or logic basic cell.

Any arbitrary function of four inputs can be realized with the aid of the second multiplexer 113 by using the outputs y3* and y3** as inputs of a third logic basic cell x5=y3* and x6=y3**). The eighth data signal input 408 is occupied by x7=d. The function f(d, c, b, a) described in equation (2) can then be realized by means of the logic basic cell 400.

A function of four inputs can thus be realized using two basis cells or logic basic cells. Only a second multiplexer 113 is used within the third cell. It must be emphasized that the actual logic resources of a cell remain free and can be utilized for other applications.

With regard to the number of inputs of the logic function within the logic basic cell, instead of a three-valued function, it is also possible to realize a four- or higher-valued function according to the same principle. Equally, the number and the type of the registers 412 to 415 within the register stage 411 is variable. By way of example, a portion of the registers 412 to 415 in accordance with FIG. 4 can be omitted. Maximum flexibility is provided in FIG. 4. The case in which all functions of the logic basic cell are actually needed as combinatorial and as register outputs does not always arise in practical application scenarios. Since registers are generally not small modules, it is possible, in order to save resources and space requirement, to manage with a smaller number of registers than in FIG. 4 and to correspondingly multiplex the combinatorial outputs.

A logic basic cell with all conceivable combinations of combinatorial and sequential outputs of the basic cell is provided if the basic cell is constructed according to the principle described. All possible input allocations of the basic cell which arise by means of combining inputs are likewise realized by the invention, even when the basic cell realizes a function of more than three inputs.

The logic basic cell according to the invention is capable of use wherever programmable or configurable logic structures are employed. The invention can be used particularly advantageously in a gate array. With a traditional FPGA, each branching can be controlled by means of a multiplexer or by means of a switch which is controlled by the impressed charge of a memory cell.

If, instead of the FPGA, a mask-programmable gate array (MPGA) is assumed as the structure, what is produced, by way of example, is an array of eight horizontal lines that are crossed by eight vertical lines in a different metal layer. An electrical coupling can be produced at the crossover points by means of a via, that is to say by means of an essentially orthogonally extending coupling structure. Consequently, all conceivable combinations between inputs and outputs can be produced easily and very compactly in the layout. A single, variable mask plane (for example "via1") suffices for logic configuration and for logic wiring. A realization as an MPGA constitutes a particularly advantageous realization with regard to the costs for a set of masks in future technology generations.

A description is given below, with reference to FIG. 5, of a logic basic cell 500 in accordance with a second exemplary embodiment of the invention.

The logic basic cell 500 is provided with first to ninth data signal inputs 501 to 509. The first data signal input 501 is coupled to a first input of a first logic function block 510 to which a first data signal $x_0$ is provided by means of the first data signal input 501. A second data signal $x_1$ is provided at a second data signal input 502 and is provided to a first data input of a first multiplexer 512. The data output of the first multiplexer 512 is coupled to a second signal input of the first logic function block 510, the output of the first logic function block 510 being coupled to a first signal input of a second multiplexer 513. The first logic function block 510 realizes the logic subfunction $f_0(x_1\sim, x_0)$. $x_1\sim$ is the output signal of the first multiplexer 512. The signal output of the first logic function block 510 is additionally coupled to a first data input of a third multiplexer 514. Furthermore, the signal output of the third multiplexer 514 is coupled to a first data signal output 518, at which the output signal $y_0$ is provided. The signal output of the first logic function block 510 is furthermore coupled to a second data signal output 519 of the logic basic cell 500 and is coupled to a first signal input of a fifth multiplexer 516. The signal output of the third multiplexer 514 is coupled to a second signal input of the fifth multiplexer 516. A third signal $x_2$ provided at a third data signal input 503 is provided to a third signal input of the fifth multiplexer 516. A fourth data signal $x_3$ is provided at a fourth data signal input 504, which is coupled to a second data input of the second multiplexer 513. The second multiplexer 513 combines the signals provided at its data inputs in order to form $x_2\sim$ (the output signal of the second multiplexer 513). The logic subfunction realized by means of the second logic function block 511 is $f_1(x_3, x_2\sim)$. The output signal of the second logic function block 511 is provided to the second data signal input of the first multiplexer 512 and is coupled to the second data signal input of the third multiplexer 514. A signal $x_5$ provided at a sixth data signal input 506 is coupled to a control input of the third multiplexer 514. A data signal output of the second logic function block 511 is coupled to a fourth signal input of the fifth multiplexer 516. Furthermore, a signal $x_6$ is provided at a seventh data signal input 507, and can be provided to a first data input of a fourth multiplexer 515. The second signal input of the fourth multiplexer 515 is coupled to an eighth data signal input 508, at which a signal $x_7$ is provided. A signal $x_8$ provided at a ninth data signal input 509 is provided to a control input of the fourth multiplexer 515, the signal output of the fourth multiplexer 515 being coupled to a fifth signal input of the fifth multiplexer 516. A first signal output of the fifth multiplexer 516 is coupled to a signal input of a flip-flop 517, to which a clock signal clk is provided at a control input. A signal $y_{reg}$ is provided at an output of the flip-flop 517, which forms a third data signal output 520 of the logic basic cell 500. The signal output of the fourth multiplexer 515 is coupled to a fourth data signal output 521, at which an output signal $y_2$ is provided. The data signal output of the second logic function block 511 is coupled to a fifth data signal output 522, at which the output signal $y_3$ is provided.

The logic basic cell from FIG. 5 realizes the Shannon decomposition, for example, by virtue of the output signals of the first and second logic function blocks 510, 511 being multiplexed by means of the third multiplexer 514, and thus being combined with the signal $x_5$.

An iterative decomposition is realized for example by means of the integration of the first logic function block 110 and of the second multiplexer 513 since the output signal of the first logic function block 510 ($f_0(x_1\sim,x_0)$) is provided to the signal input of the second multiplexer 513', thereby forming a pipeline-like structure.

In a configuration in which the third multiplexer 514 is set up as a multiple function device, so that it can be operated selectively as a multiplexer or as a logic function block with a functionality similar to that of the logic function blocks 510, 511, a disjoint decomposition can be realized if the third multiplexer 514 is operated in the function mode as logic function block.

The logic basic cell 500 shown in FIG. 5 can be connected up to arbitrary other logic basic cells by connecting up inputs 501 to 509 and outputs 518 to 522 of the logic basic cell 500 to inputs and outputs of other logic basic cells. Logic subfunctions, such as $f_0(x_1\sim, x_0)$, by way of example, can be provided directly to data signal outputs (here to the second data signal output 519 $y_1$). Furthermore, a register is provided, for which purpose a flip-flop may be used.

In the case of the exemplary embodiment of the logic basic cell 500 according to the invention as shown in FIG. 5, the multiplexers 512, 513 and 516 are to be regarded as structural multiplexers since they contribute to the logic function of the logic basic cell 500 only insofar as they select between different possible paths. This demarcation relative to the functional multiplexers, namely the third and fourth multiplexers 514, 515, is of importance particularly for the realization of the logic basic cell 500 in a structured ASIC (MPGA), since static multiplexers with invariable multiplex functionality can be designed as via- or metal-programmed comb structures in such a case.

A description is given below, with reference to FIG. 6A, FIG. 6B, of two embodiments for multiplexers which are realized as invariable hardware elements.

Figure 6A:
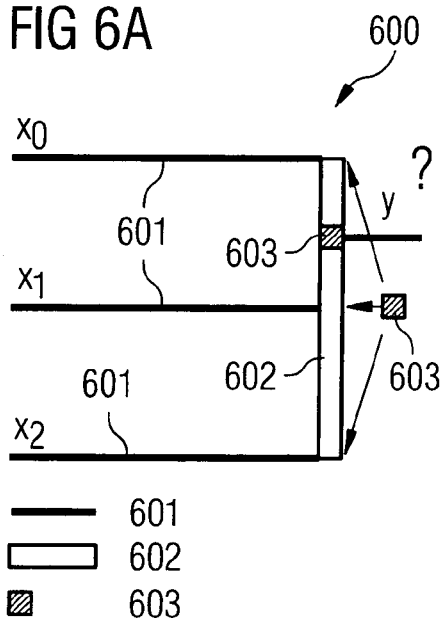
FIGS. 6A, 6B show schematic views of multiplexers which are realized by means of hardware elements provided in an invariable fashion.

FIG. 6a shows a via-programmed multiplexer 600, in which interconnects are embodied in an n-th metallization plane 601, it being possible for signals $x_0$, $x_1$ and $x_2$ to be provided on the interconnects. By means of a via 603 that can be fitted in a variable fashion, the n-th metallization plane 601 can be coupled to an (n−1)-th metallization plane 602, thereby realizing a static multiplexer functionality.

The metal-programmed multiplexer 610 shown in FIG. 6B is again shown with interconnects in the n-th metallization plane 601 on which signals $x_0$, $x_1$ and $x_2$ can be passed, it being possible for the desired multiplexer functionality to be fixedly set once by means of coupling only one of the interconnects to an output y.

Figure 6B:
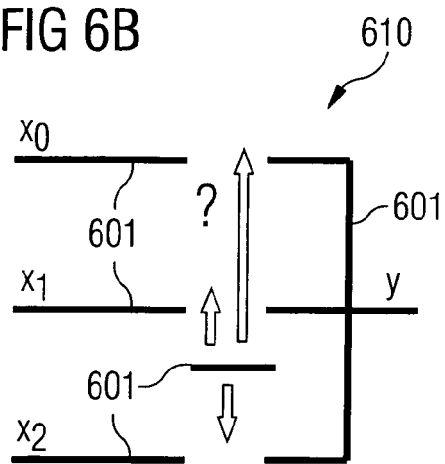

To put it another way, FIG. 6A and FIG. 6B show a via-programmed multiplexer 600 and a metal-programmed multiplexer 610. By virtue of this realization, the multiplexers 512, 513, 516 shown in FIG. 5 can be formed without additional transistors and thus with reduced dimensioning.

The via-programmed multiplexer 600 and the metal-programmed multiplexer 610 are configurations of the static multiplexers 512, 513, 516 whose multiplexer functionality is fixedly predefined and configured in terms of hardware a single time, and is no longer changed thereafter.

Consequently, FIG. 6A illustrates a via-programmed 3:1 multiplexer 600 and FIG. 6B illustrates a metal-programmed 3:1 multiplexer 610.

The multiplexers 514, 515 from FIG. 5 serve for mapping Shannon-decomposed functions: in the case of the multiplexer 514 within the logic basic cell 500 and in the case of the multiplexer 515 for the combination of a plurality of basic cells, namely the logic basic cell 500 shown in FIG. 5 and at least one other logic basic cell not shown in FIG. 5, which generate, as output signals, the signals $x_6$, $x_7$ provided at the seventh and eighth data signal inputs 507, 508.

A description is given below, with reference to FIG. 7 of a logic basic cell arrangement 700 in accordance with an exemplary embodiment of the invention.

The logic basic cell arrangement 700 contains a first logic basic cell 701 according to the invention, a second logic basic cell 702 according to the invention and a third logic basic cell 703 according to the invention, which are connected up to one another. It should be noted that the logic basic cells 701 to 703 in FIG. 7 are shown only schematically and only partly, so that, in particular, not all the components and decompositions of the logic basic cell 701 to 703 are shown in FIG. 7.

The logic basic cell arrangement 700 is provided with first to seventh data signal inputs 704 to 710, at which signals a to g are provided. As is indicated schematically in FIG. 7, a function of three data signals c, b, a, namely $f_0$(c, b, a), is realized by means of the first logic basic cell 701. A function $f_1$(c, b, a) of the three data signals a, b, c, is realized by means of the second logic basic cell 702. A function $f_2$(g, f, e) of the data signals g, f, e and a function $f_3$(d, c, b, a) of the four data signals d, c, b, a are realized by means of the third logic basic cell 703. The function $f_2$ is provided at a first data signal output 711 and the function $f_3$ is presented at a second data signal output 312.

Figure 7:
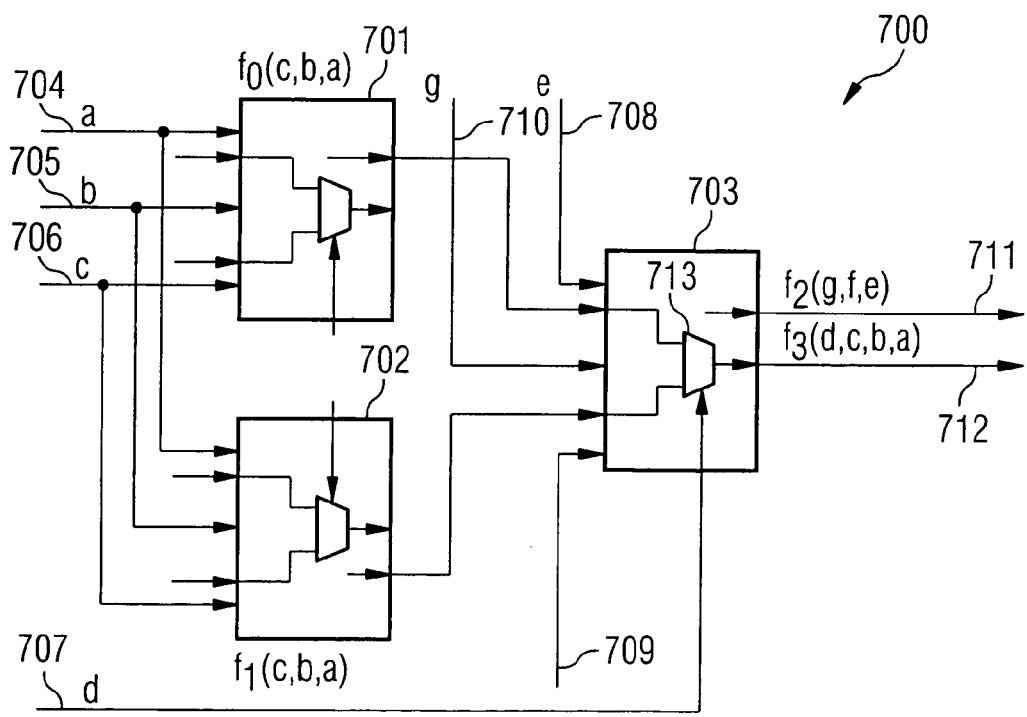
FIG. 7 shows a logic basic cell arrangement in accordance with a second exemplary embodiment of the invention.

Furthermore, FIG. 7 illustrates a multiplexer 713 in the third logic basic cell 703, in which output signals of the first and second logic basic cells 701, 702 are logically combined with one another.

To put it another way, FIG. 7 shows the formation of a function $f_3$ of four input signals from two basic cells 701, 702 and the multiplexer 713 of the third logic basic cell 703. As an alternative, a free multiplexer from the first logic basic cell 701 or from the second logic basic cell 702 may also be used as multiplexer 713.

In the case of the basis complexity of n inputs per logic basic cell, $2^k$ logic basic cells are required to represent a logic function of n+k inputs with the aid of the Shannon decomposition. As an alternative, however, some logic functions may also be represented in accordance with equations (3), (4), (5). For this purpose, the logic path via the first and second multiplexers 512, 513 from FIG. 5 is then utilized, for example. The advantage that can be achieved thereby becomes clear if the following function is considered by way of example:

$$f(e, d, c, b, a) = e \oplus d \oplus c \oplus b \oplus a \quad (16)$$

This function of five inputs e, d, c, b, a can be realized in a Shannon-decomposed fashion using equation (1) using four logic basic cells if the use of common subfunctions is dispensed with.

$$e \oplus d \oplus c \oplus b \oplus a = {}_s(f_s(f_1(a, b, c), f_2(a, b, c), d), f_s(f_3(a, b, c), f_4(a, b, c), d)) \, e) \quad (17)$$

If, however, an iterative decomposition is used in accordance with equations (3), (4), (5), then only two logic basic cells are required for realizing these functions:

$$e \oplus d \oplus c \oplus b \oplus a = f_\oplus(f_\oplus(f_\oplus(e, d), c), b), a) \quad (18)$$

In this case, the critical path runs through four gates.

The third data signal input 503, at which the signal $x_2$ is provided, forms that combinatorial input by means of which the register 516 can be reached directly without taking up combinatorial resources.

The register 517 itself may have more than one output. Apart from a sequential output and the logically opposite potential thereof, additional register signals may be present at the output. The register function itself may be designed to be configurable.

A description is given below, with reference to FIG. 8, of a logic basic cell 800 in accordance with a third exemplary embodiment of the invention.

Figure 8:
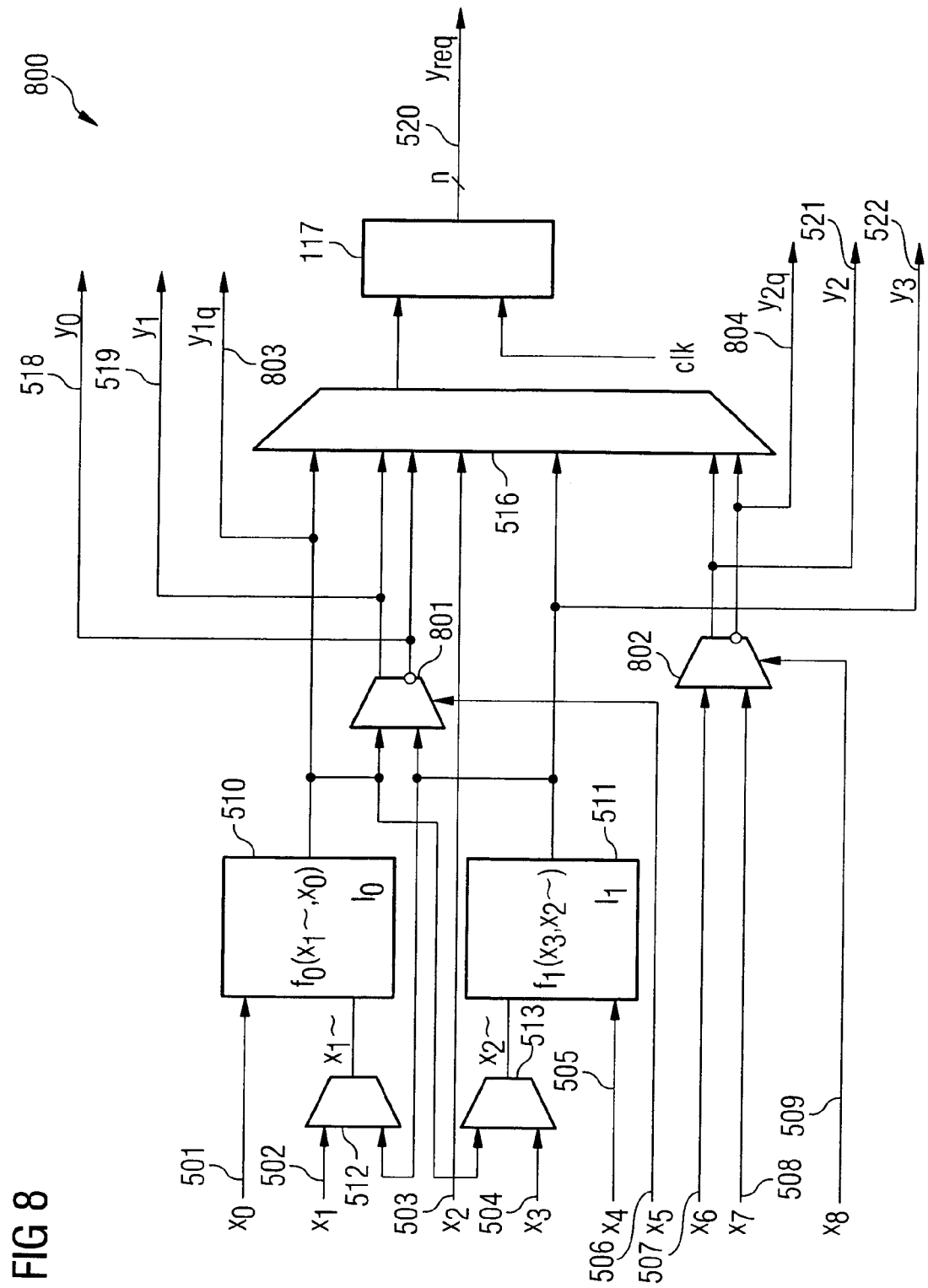
FIG. 8 shows a logic basic cell in accordance with a third exemplary embodiment of the invention.

The logic basic cell 800 shown in FIG. 8 differs from the logic basic cell 500 shown in FIG. 5 essentially by virtue of the fact that the functional multiplexers 514, 515 from FIG. 1 are replaced by a first double output multiplexer 801 and by a second double output multiplexer 802, respectively. The first double output multiplexer 801 has, in addition to the data signal output of the third multiplexer 514 as shown in FIG. 5, an additional data signal output, at which is provided the complementary signal with respect to the output signal provided at the first data signal output. This complementary signal is fed to the fifth multiplexer 516 and is furthermore provided at the first data signal output 518. Moreover, a sixth data signal output 803 is provided, at which the output signal of the first double output multiplexer 801 is provided.

The fourth multiplexer 515 from FIG. 5 is replaced by a second double output multiplexer 802, at the outputs of which are provided not only the output signal of the fourth multiplexer 515 but additionally, at an additional data signal output of the second double output multiplexer 802, the signal that is the logic inverse of the output signal. The output signal and the inverse output signal with respect thereto are fed to the fifth multiplexer 516. Furthermore, the two signals are provided at the fourth data signal output 521 and at a seventh data signal output 804.

The realization of the invention shown in FIG. 8 is produced by replacing the functional multiplexers 514, 515 from FIG. 5 by the first and second double output multiplexers 801, 802, which are designed in such a way that they always output their result in a negated fashion and additionally in a non-negated fashion. This has the advantage that even common subfunctions that differ only in sign only have to be calculated once if the Shannon decomposition is used. This emerges from (19):

$$f(a_n, a_{n-1}, \ldots, a_1, a_0) = \overline{a_n} g(a_{n-1}, \ldots, a_1, a_0) + a_n \overline{g(a_{n-1}, \ldots, a_1, a_0)} \quad (19)$$

Since the first and second double output multiplexers 801, 802 provide both the logic result $g(a_{n-1} \ldots a_0)$ and the negation thereof simultaneously, the parity function can be generated directly by the next multiplexer by the control input thereof being occupied by $a_n$.

Equation (16) can be decomposed in this case as follows:

$$e \oplus d \oplus c \oplus b \oplus a = f_s(\overline{f_s(f_\oplus(a, b, c), f_\oplus(a, b, c), d)}, f_s(\overline{f_\oplus(a, b, c)}, f_\oplus(a, b, c), d)), e) \quad (20)$$

The decomposition in equation (20) requires two cells with a critical path which runs through one gate and three multiplexers.

In order to support disjoint decompositions as well, instead of the second double output multiplexer 802, it is again possible to provide a fully configurable logic basic cell which can realize all functions of two inputs but can furthermore also be operated as a 2:1 multiplexer. This achieves a maximum of flexibility in the mapping of logic functions. In particular, it is then also possible to implement disjoint decompositions in accordance with equation (6), (7) more efficiently.

$$e \oplus d \oplus c \oplus b \oplus a = f_\oplus(f_\oplus(a, b, c), f_\oplus(d, e)) \quad (21)$$

This decomposition can likewise be realized by means of two logic basic cells. In this case, the critical path runs only through two gates and one multiplexer.

A description is given below, with reference to FIG. 9, of a logic basic cell 900 in accordance with a third exemplary embodiment of the invention.

In accordance with the above description, in the case of the logic basic cell 900, the second double output multiplexer 802 from FIG. 8 is replaced by a multifunction device 901, which can be operated as a multiplexer in a multiplex operating state and which realizes, in a logic function operating state, an arbitrarily selectable logic function for combining the input signals ($x_6$, $x_7$) provided at its inputs.

Maximum logic flexibility is essential above all with regard to the integration of the basic cell in the standard tool flow. ASIC network lists based on basic gates can directly be used further with the logic basic cell according to the invention.

Figure 9:
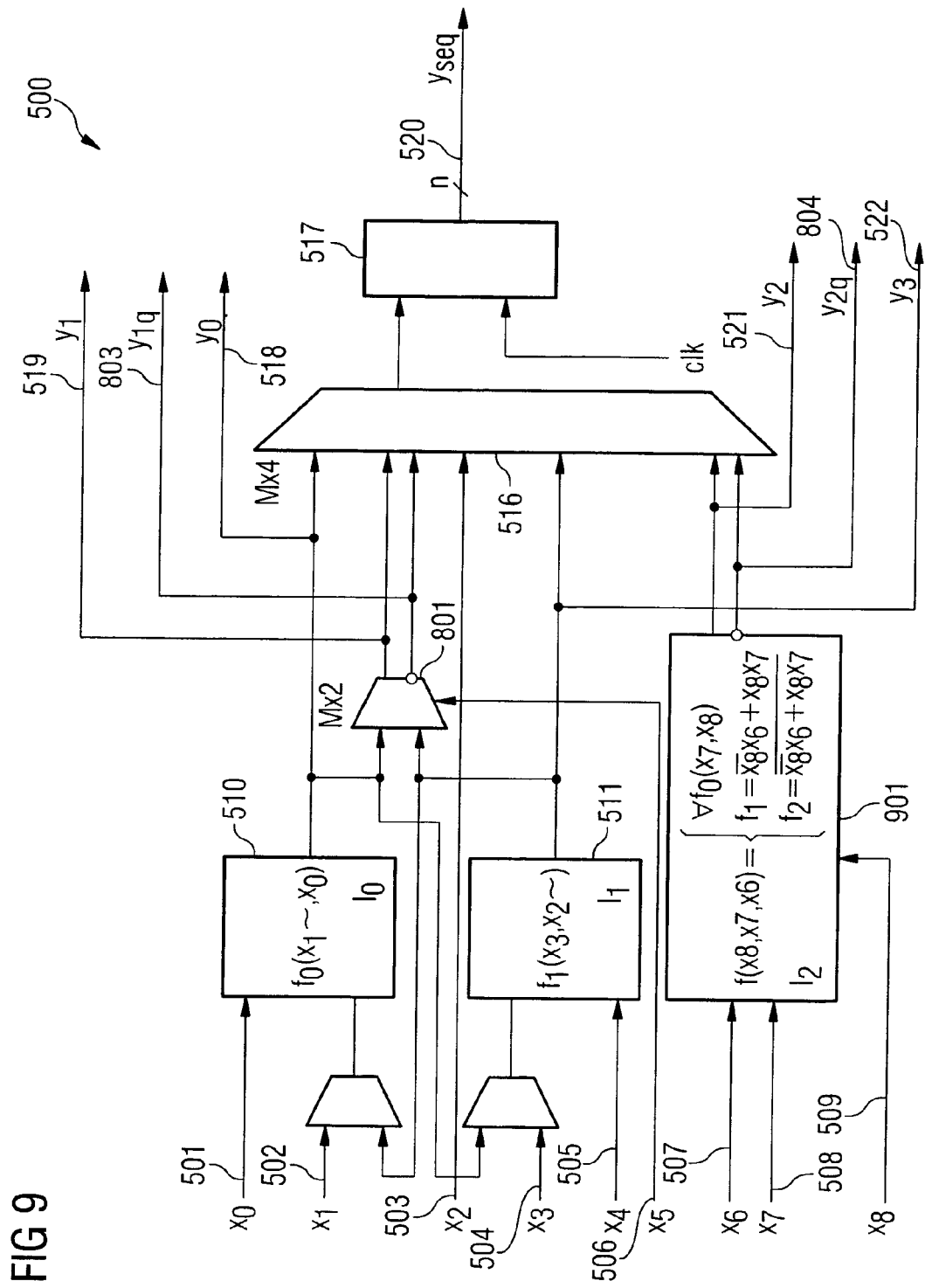
FIG. 9 shows a logic basic cell in accordance with a fourth exemplary embodiment of the invention.

It goes without saying that it is also possible, in departure from FIG. 9 for the first double output multiplexer 801 to be replaced by a multifunction device, thereby enabling disjoint decompositions at any complexity level of a logic function. The first logic function block 510 and the second logic function block 511 may also be replaced by a multifunction device. Multiplexers 513, 514 or 801, 802 may even be simple multiplexers (see FIG. 5), multiplexers with an inverted/noninverted output (see FIG. 8) or logic cells which can realize any function of two inputs and an inverted and noninverted multiplexer function. However, an embodiment of the invention in which the first logic function block 510 in FIG. 5 is completely absent is also possible. Its function can be performed for example by an external circuitry of multiplexer 515. It is equally possible to dispense with the multiplexer 515 when the inputs of the multiplexer 514 are reached with the aid of two additional structural multiplexers for inputs of the cell.

The first and second logic function blocks 510, 511 may be in any desired combination for the realization of the multiplexers 514, 515 or 801, 802 or 801, 901 and either be logic cells which realize any function of two inputs or be logic cells which can realize any function of two inputs and an inverted or noninverted 2:1 multiplexer function.

The invention furthermore encompasses logic basic cells which contain more than two combinatorial logic function blocks 510, 511 which are provided with more than one multiplexer such as the multiplexer 801 from FIG. 8 or which contain more than one free multiplexer or no free multiplexer such as multiplexer 802 in FIG. 8. In cells of logically higher complexity, the multiplexers, as discussed, may be realized in particular in three variants. All variants are possible for the realization of the combinatorial cells 510, 511, too.

Even if the combinatorial basic cells corresponding to the logic function blocks 510, 511 do not realize all possible functions but rather only some functions of two inputs, but are situated in a structure such as in FIG. 5, FIG. 8 or FIG. 9 or a discussed variant thereof, this is concomitantly encompassed by this invention.

FIG. 10 shows a logic basic cell 1000 in accordance with yet another configuration of the invention.

The structure of the logic basic cell 1000 essentially corresponds to that of the logic basic cell 900 from FIG. 9 with the difference that the first double output multiplexer 801 is replaced by a first multifunctional device 1001. The structure of a second multifunction device 1002 corresponds to that of the multifunction device 901 from FIG. 9.

The first multifunction device 1001 and the second multifunctional device 1002 may have the same or a different construction; to put it another way, the first multifunction device 1001 and the second multifunction device 1002 may be set up for realizing the same type of decomposition of the logic function into a plurality of logic subfunctions (Shannon decomposition, iterative decomposition or disjoint decomposition); as an alternative, the first multifunction device 1001 and the second multifunction device 1002 may, however, also in each case realize a different type of decomposition, in particular:

first multifunction device 1001:
  Shannon decomposition,
  second multifunction device 1002:
  Shannon decomposition;
first multifunction device 1001:
  Shannon decomposition,
  second multifunction device 1002:
  iterative decomposition;
first multifunction device 1001:
  Shannon decomposition,
  second multifunction device 1002:
  disjoint decomposition;
first multifunction device 1001:
  iterative decomposition,
  second multifunction device 1002:
  Shannon decomposition;
first multifunction device 1001:
  iterative decomposition,
  second multifunction device 1002:
  iterative decomposition;
first multifunction device 1001:
  iterative decomposition,
  second multifunction device 1002:
  disjoint decomposition;
first multifunction device 1001:
  disjoint decomposition,
  second multifunction device 1002:
  Shannon decomposition;
first multifunction device 1001:
  iterative decomposition,
  second multifunction device 1002:
  disjoint decomposition;
first multifunction device 1001:
  disjoint decomposition,
  second multifunction device 1002:
  disjoint decomposition.

The logic basic cell 1000 in accordance with FIG. 10 thus represents the most general case with regard to the division of the two decomposition units.

The invention claimed is:

1. A logic basic cell for forming at least one output signal from at least three input signals in accordance with a predeterminable logic function, comprising:
  a first unit for realizing a first decomposition of the logic function into a plurality of logic subfunctions; and
  a second unit for realizing a second decomposition of the logic function into a plurality of logic subfunctions;
  wherein each of the first unit and the second unit is set up for realizing a Shannon decomposition, or for realizing an iterative decomposition, or for realizing a disjoint decomposition, wherein the first unit is set up as a Shannon decomposition unit for realizing a Shannon decomposition of a logic function into a plurality of logic subfunctions, further comprising:
at least eight data signal inputs, it being possible for a data signal to be provided at each of the data signal inputs;
a first logic function block, which is coupled to a first data signal input and a second data signal input of the data signal inputs, and is located within the first unit;
a second logic function block, which is coupled to a third data signal input and a fourth data signal input of the data signal inputs, and is located within the second unit;
at least one logic function configuration input, by means of which it is possible to predetermine a logic subfunction which can be realized by the respective logic function block from a plurality of logic subfunctions which can be realized for combining the data signals present at the respective logic function block;
the Shannon decomposition unit having a first multiplexer, the first data input of which is coupled to an output of the first logic function block and the second data input of which is coupled to an output of the second logic function block and the control input of which is coupled to a fifth data signal input of the data signal inputs; and
a first data signal output coupled to the output of the first logic function block, a second data signal output coupled to the output of the second logic function block, and a third data signal output coupled to an output of the first multiplexer, at which data signal outputs it is possible to tap off separately in each case a signal at the output of the first logic function block, a signal at the output of the second logic function block and a signal at the output of the first multiplexer, respectively, wherein the second unit which realizes an additional decomposition of the logic function into a plurality of logic subfunctions comprises a second multiplexer, the control input of which is coupled to a sixth data signal input of the data signal inputs, the first data input of which is coupled to a seventh data signal input of the data signal inputs and the second data input of which is coupled to an eighth data signal input of the data signal inputs.

2. The logic basic cell as claimed in claim 1, wherein the first data signal input is coupled to the third data signal input and/or the second data signal input is coupled to the fourth data signal input.

3. The logic basic cell as claimed in claim 1, wherein at least one of the logic function blocks comprises:
a first signal path having a plurality of transistors of a first conduction type, said first signal path being coupled to at least a portion of the data signal inputs of the respective logic function block, it being possible for the transistors to be connected to one another such that they realize the logic subfunction which can be realized by the respective logic function block from all possible logic subfunctions for combining the data signals present at the respective logic function block, so that an output signal representing a result of the logic subfunction is provided; and
a second signal path having a plurality of transistors of a second conduction type complementary to the first conduction type, said second signal path being coupled to at least a portion of the data signal inputs of the respective logic function block, it being possible for the transistors to be connected to one another such that they realize an inverse logic subfunction with respect to that of the transistors of the first signal path from all possible logic subfunctions for logically combining the two data signals, so that an output signal representing a result of the logic subfunction is provided.

4. The logic basic cell as claimed in claim 1, wherein at least one of the logic function blocks is formed as programmable logic device, field-programmable gate array, mask-programmed application-specific integrated circuit, logic gate or arrangement of a plurality of logic gates, or look-up table.

5. The logic basic cell as claimed in claim 1, wherein the logic subfunction which can be realized is predetermined for the respective logic function block in an invariable fashion at the at least one logic function configuration input.

6. The logic basic cell as claimed in claim 5, further comprising a storage device which is coupled to the at least one logic function configuration input and in which the information for predetermining the logic subfunction which can be realized can be stored.

7. The logic basic cell as claimed in claim 1, wherein the logic subfunction which can be realized is predetermined for the respective logic function block in a variable fashion by means of a signal which can be applied at the at least one logic function configuration input.

8. The logic basic cell as claimed in claim 1, set up for processing digital data signals.

9. The logic basic cell as claimed in claim 1, further comprising at least one register which is connected downstream of the first and second logic function blocks and the first and second multiplexers and serves for tapping off signals which can be provided at at least one output of the logic basic cell.

10. The logic basic cell arrangement as claimed in claim 9, wherein the output of the first multiplexer of a first logic basic cell is coupled to the first data input of the second multiplexer of a second logic basic cell.

11. The logic basic cell arrangement as claimed in claim 10, wherein the output of the first multiplexer of a third logic basic cell is coupled to the second data input of the second multiplexer of the second logic basic cell.

12. The logic basic cell arrangement as claimed in claim 11, wherein at least one of the data inputs of the second multiplexer of the first and/or of the third logic basic cell is free of a coupling to other logic basic cells.

13. The logic basic cell arrangement as claimed in claim 12, wherein the first and/or the second logic function block and/or the first multiplexer of the second logic basic cell are free of a coupling to other logic basic cells.

14. The logic basic cell arrangement as claimed in claim 13, wherein at least a portion of the at least one logic function block and/or multiplexer free of a coupling to other logic basic cells can be connected to an additional circuit such that the at least one logic function block and/or multiplexer contributes to the functionality of the additional circuit.

15. The logic basic cell as claimed in claim 1,
wherein the second unit which realizes an additional decomposition is set up for realizing an iterative decomposition, and
realizes the iterative decomposition by means of a first logic function block, having at least two data signal inputs, to which at least two input signals can be applied, and having a data signal output for providing a logic combination of the at least two input signals realized in accordance with a predeterminable logic subfunction.

16. The logic basic cell as claimed in claim 15, wherein the second unit which realizes an additional decomposition furthermore realizes the iterative decomposition by means of a multiplexer, having a first and having a second data signal input and having a data signal output, the data signal output of the first logic function block being coupled to the first data signal input of the multiplexer, it being possible for an additional input signal to be provided at the second data signal input of the multiplexer.

17. The logic basic cell as claimed in claim 15, wherein at least one of the logic function blocks is formed as logic gate or arrangement of a plurality of logic gates, or look-up table.

18. The logic basic cell as claimed in claim 15, wherein the logic subfunction which can be realized is predetermined for the respective logic function block in an invariable fashion at at least one logic function configuration input.

19. The logic basic cell as claimed in claim 15, wherein the logic subfunction which can be realized is predetermined for the respective logic function block in a variable fashion by means of a signal which can be applied at at least one logic function configuration input.

20. The logic basic cell as claimed in claim 1, wherein the second unit which realizes an additional decomposition is set up for realizing an iterative decomposition and for realizing a disjoint decomposition.

21. The logic basic cell as claimed in claim 1, set up as an application-specific integrated circuit.

22. The logic basic cell as claimed in claim 1, set up as programmable logic device, field-programmable gate array, or mask-programmed application-specific integrated circuit.

23. The logic basic cell as claimed in claim 1, set up as a CMOS logic basic cell.

24. A logic basic cell arrangement having a plurality of logic basic cells as claimed in claim 1 that are connected to one another.

25. A logic basic cell for forming at least one output signal from at least three input signals in accordance with a predeterminable logic function, comprising:
 a first unit for realizing a first decomposition of the logic function into a plurality of logic subfunctions; and
 a second unit for realizing a second decomposition of the logic function into a plurality of logic subfunctions;
 wherein each of the first unit and the second unit is set up for realizing a Shannon decomposition, or for realizing an iterative decomposition, or for realizing a disjoint decomposition,
 wherein the second unit which realizes an additional decomposition is set up for realizing a disjoint decomposition, and
 realizes the disjoint decomposition by means of a first logic function block, a second logic function block and a third logic function block, the second logic function block realizing a first logic subfunction of at least two input signals, the third logic function block realizing a second logic subfunction of at least two input signals, and the third logic function block realizing a logic combination of the output signals of the first and of the second logic function block,
 wherein the second unit which realizes an additional decomposition realizes the disjoint decomposition by means of a multiple function device that selectively realizes a multiplex functionality of at least two input signals or the functionality of forming a logic subfunction of at least two input signals.

26. The logic basic cell as claimed in claims 25, wherein a changeover is made between the multiplexer of the Shannon decomposition unit and the multiple function device by means of an invariable hardware element and the function of the multiple function device is likewise realized by an invariable hardware element.

27. The logic base cell as claimed in claim 26 wherein the multiplexer and/or the multiple function device are realized by means of a plurality of metallization planes and/or by means of vias.

28. A logic basic cell for forming at least one output signal from at least three input signals in accordance with a predeterminable logic function, comprising:
 a first unit for realizing a first decomposition of the logic function into a plurality of logic subfunctions; and
 a second unit for realizing a second decomposition of the logic function into a plurality of logic subfunctions;
 wherein each of the first unit and the second unit is set up for realizing a Shannon decomposition, or for realizing an iterative decomposition, or for realizing a disjoint decomposition,
 wherein the first unit is set up as a Shannon decomposition unit for realizing a Shannon decomposition of a logic function into a plurality of logic subfunctions, and
 wherein the Shannon decomposition unit realizes the Shannon decomposition by means of a first logic function block, a second logic function block and a multiplexer, the first logic function block realizing a first logic subfunction of at least two input signals, the second logic function block realizing a second logic subfunction of at least two input signals, and the multiplexer combining the output signals of the two logic function blocks with one another and with an additional input signal.

* * * * *